United States Patent
Yahiro

(10) Patent No.: US 11,276,546 B2
(45) Date of Patent: Mar. 15, 2022

(54) CHARGED PARTICLE BEAM OPTICAL SYSTEM, EXPOSURE APPARATUS, EXPOSURE METHOD AND DEVICE MANUFACTURING METHOD

(71) Applicant: NIKON CORPORATION, Tokyo (JP)

(72) Inventor: Takehisa Yahiro, Ageo (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 16/492,677

(22) PCT Filed: Mar. 16, 2017

(86) PCT No.: PCT/JP2017/010742
§ 371 (c)(1),
(2) Date: Sep. 10, 2019

(87) PCT Pub. No.: WO2018/167924
PCT Pub. Date: Sep. 20, 2018

(65) Prior Publication Data
US 2020/0051774 A1   Feb. 13, 2020

(51) Int. Cl.
*H01J 37/141* (2006.01)
*G03F 7/20* (2006.01)
(Continued)

(52) U.S. Cl.
CPC ........ *H01J 37/141* (2013.01); *G03F 7/70025* (2013.01); *H01J 37/09* (2013.01);
(Continued)

(58) Field of Classification Search
CPC ...... H01J 37/09; H01J 37/141; H01J 37/3174; H01J 2237/1415; G03F 7/70025; H01L 21/0273
See application file for complete search history.

(56) References Cited

U.S. PATENT DOCUMENTS 6,441,384 B1 * 8/2002 Kojima ................. B82Y 10/00
   250/492.22
6,639,227 B1 * 10/2003 Glavish ................. H01J 37/05
   250/296
(Continued)

FOREIGN PATENT DOCUMENTS

JP    2000-003690 A       1/2000
JP    2000003690 A  *    1/2000
(Continued)

OTHER PUBLICATIONS

May 30, 2017 International Search Report issued in International Patent Application No. PCT/JP2017/010742.
(Continued)

*Primary Examiner* — David E Smith
(74) *Attorney, Agent, or Firm* — Oliff PLC

(57) ABSTRACT

A charged particle beam optical system is provided with a plurality of irradiation optical systems each of which irradiates an object W with a charged particle beam EB, the plurality of irradiation optical system includes a first irradiation optical system and a second irradiation optical system that generates a second magnetic field having a characteristics different from a characteristics of a first magnetic field generated by the first irradiation optical system.

17 Claims, 19 Drawing Sheets

(51) Int. Cl.
*H01J 37/09* (2006.01)
*H01J 37/317* (2006.01)
*H01L 21/027* (2006.01)

(52) U.S. Cl.
CPC ...... *H01J 37/3174* (2013.01); *H01L 21/0273* (2013.01); *H01J 2237/1415* (2013.01)

(56) References Cited

U.S. PATENT DOCUMENTS

| | | | | |
|---|---|---|---|---|
| 2001/0004185 | A1* | 6/2001 | Muraki | H01J 37/3026 |
| | | | | 313/359.1 |
| 2005/0023486 | A1* | 2/2005 | Takakuwa | B82Y 10/00 |
| | | | | 250/492.2 |
| 2005/0029473 | A1* | 2/2005 | Muraki | B82Y 40/00 |
| | | | | 250/492.1 |
| 2006/0076491 | A1* | 4/2006 | Yasuda | B82Y 40/00 |
| | | | | 250/310 |
| 2006/0289781 | A1 | 12/2006 | Tanimoto et al. | |
| 2011/0226967 | A1* | 9/2011 | Yamada | H01J 37/3175 |
| | | | | 250/492.2 |
| 2013/0161511 | A1* | 6/2013 | Karimata | H01J 37/28 |
| | | | | 250/307 |
| 2015/0325404 | A1* | 11/2015 | Sugiyama | H01J 37/3177 |
| | | | | 250/396 R |
| 2016/0133438 | A1 | 5/2016 | Yamada et al. | |
| 2017/0003235 | A1* | 1/2017 | Firnkes | H01J 37/244 |

FOREIGN PATENT DOCUMENTS

| | | |
|---|---|---|
| JP | 2004-055933 A | 2/2004 |
| JP | 2005-203464 A | 7/2005 |
| JP | 2007-012306 A | 1/2007 |
| JP | 2008-041890 A | 2/2008 |

OTHER PUBLICATIONS

May 30, 2017 Written Opinion issued in International Patent Application No. PCT/JP2017/010742.

* cited by examiner

CHARGED PARTICLE BEAM OPTICAL SYSTEM, EXPOSURE APPARATUS, EXPOSURE METHOD AND DEVICE MANUFACTURING METHOD

TECHNICAL FIELD

The present invention relates to a charged particle beam optical system that is configured to irradiate an object with a charged particle beam, an exposure apparatus having a charged particle beam optical system, an exposure method using an exposure apparatus and a device manufacturing method for manufacturing a device by using an exposure method, for example.

BACKGROUND ART

An exposure apparatus that is configured to use a charged particle beam (for example, an electron beam) as an exposure beam is proposed as an exposure apparatus used in a lithography process to manufacture a device such as a semiconductor element. For example, a Patent Literature 1 discloses an exposure apparatus that is configured to expose a substrate by forming many circular spots that are smaller than a resolution limit of an exposure apparatus using an ultraviolet light as an exposure light by an electron beam and moving the circular spots relatively with respect to an object such as the substrate.

This electron beam exposure apparatus is configured to control the charged particle beam by using a magnetic field generator (for example, an electromagnetic lens) configured to generate a magnetic field. However, when the magnetic field used to control the charged particle beam leaks on the object such as the substrate, there is a possibility that an exposure accuracy deteriorates.

CITATION LIST

Patent Literature

Patent Literature 1: US2016/0133438A1

SUMMARY OF INVENTION

A first aspect of the present invention provides an charged particle beam optical system comprising a plurality of irradiation optical system each of which is configured to irradiate an object with a charged particle beam, the plurality of irradiation optical system including a first irradiation optical system and a second irradiation optical system that generates a second magnetic field having a characteristics different from a characteristics of a first magnetic field generated by the first irradiation optical system.

A second aspect of the present invention provides an exposure apparatus that is provided with the above described charged particle beam optical system in the first aspect of the present invention.

A third aspect of the present invention provides an exposure method of exposing the object by using the above described exposure apparatus in the second aspect of the present invention.

A fourth aspect of the present invention provides a device manufacturing method including a lithography step, the object is exposed by the above described exposure method in the third aspect of the present invention in the lithography step.

An operation and another advantage of the present invention will be apparent from an embodiment described below.

BRIEF DESCRIPTION OF DRAWINGS

Each of FIG. 10A

DESCRIPTION OF EMBODIMENTS

Hereinafter, with reference to drawings, an embodiment of a charged particle beam optical system, an exposure apparatus, an exposure method and a device manufacturing method will be described. In the below described description, the embodiment of the charged particle beam optical system, the exposure apparatus, the exposure method and the device manufacturing method will be described by using an exposure system SYS that is provided with an exposure apparatus (namely, an electron beam exposure apparatus) EX that is configured to expose a wafer W by irradiating the wafer W with an electron beam EB. The exposure apparatus EX may expose the wafer W to draw a pattern on the wafer W by the electron beam EB and may expose the wafer W to transfer a pattern of a micro mask to the wafer W by the electron beam EB.

Moreover, in the below described description, a positional relationship of various components that constitute the exposure system SYS will be described by using an XYZ rectangular coordinate system that is defined by a X axis, a Y axis and a Z axis that are perpendicular to one another. Note that each of an X axis direction and a Y axis direction is a horizontal direction (namely, a predetermined direction in a horizontal plane) and a Z axis direction is a vertical direction (namely, a direction that is perpendicular to the horizontal plane, and substantially an up-down direction), for the purpose of simple description. Note that the Z axis direction is also a direction that is parallel to an optical axis AX of each of a plurality of below described electron beam optical systems 12 of the exposure apparatus EX. Moreover, rotational directions (in other words, inclination directions) around the X axis, the Y axis and the Z axis are referred to as a θX direction, a θY direction and a θZ direction, respectively.

(1) Structure of Exposure System SYS

Firstly, with reference to FIG. 1 to FIG. 6, a structure of the exposure system SYS will be described.

(1-1) Overall Structure of Exposure System SYS

Figure 1:
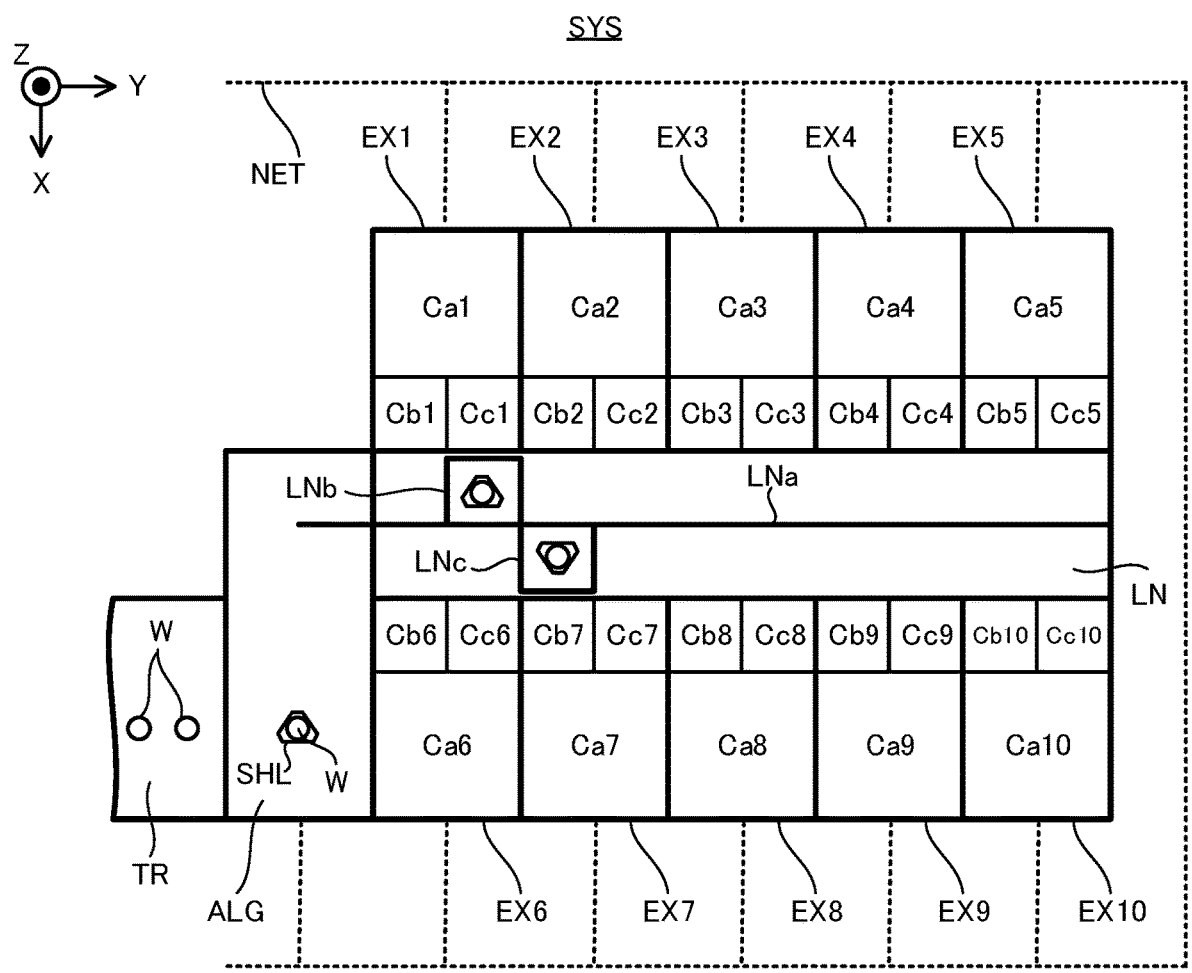
FIG. 1 is a top view that illustrates an overall structure of an exposure system.

Firstly, with reference to FIG. 1, an overall structure of the exposure system SYS will be described. FIG. 1 is a top view that illustrates the overall structure of the exposure system SYS.

As illustrated in FIG. 1, the exposure system SYS is provided with a plurality of exposure apparatuses EX. In an example illustrated in FIG. 1, the exposure system SYS is provided with ten exposure apparatuses EX (specifically, the exposure apparatus EX1 to the exposure apparatus EX10). The exposure apparatus EX1 to the exposure apparatus EX5 are arranged in line along a predetermined arrangement direction (the Y axis direction in the example illustrated in FIG. 1). The exposure apparatus EX6 to the exposure apparatus EX10 are arranged in parallel with the exposure apparatus EX1 to the exposure apparatus EX5 in line along a predetermined arrangement direction (the Y axis direction in the example illustrated in FIG. 1).

Each exposure apparatus EX is provided with an exposure chamber Ca, a load chamber Cb and an unload chamber Cc. Namely, the exposure apparatus EXq (note that q is an integer value from 1 to 10) is provided with the exposure chamber Caq, the load chamber Cbq and the unload chamber Ccq.

Each of the exposure chamber Ca, the load chamber Cb and the unload chamber Cc is configured to evacuate an inner space therein so that the inner space becomes a vacuum space. The exposure chamber Ca generates a vacuum space in which the electron beam EB is irradiated to the wafer W to expose the wafer W. The load chamber Cb generates a vacuum space for loading (namely, carrying in) the wafer W from an outside of the exposure chamber Ca to an inside of the exposure chamber Ca. The unload chamber Cc generates a vacuum space for unloading (namely, carrying out) the wafer W from the inside of the exposure chamber Ca to the outside of the exposure chamber Ca.

The wafer W is a semiconductor substrate on which an electron beam resist (alternatively, any photosensitive agent or sensitive member) is coated. The wafer W is a circular-plate-like substrate having a diameter of 300 mm and a thickness of 700 micrometer to 800 micrometer, for example. However, the wafer W may be a substrate having any shape and any size. A plurality of quadrangular shot areas S are allowed to be set on the wafer W, wherein the plurality of shot areas S are exposed by a plurality of electron beams EB, respectively, irradiated from the plurality of below described electron beam optical systems 12 of the exposure apparatus EX. For example, when the size of one shot area S is 26 mm×33 mm, 100 shot areas S are allowed to be set on the wafer W. Note that the shot area S at least one portion of which is missing may be set on the wafer W.

The exposure system SYS is further provided with a transport track TR via which the wafer W on which the electron beam resist is coated is transported from and/or to a not-illustrated coater/developer with an in-line method and an alignment apparatus ALG that executes an alignment of the wafer W carried in the exposure system SYS via the transport track TR. The alignment apparatus ALG receives the wafer W carried via the transport track TR by using a not-illustrated transport arm. Then, the alignment apparatus ALG mounts the wafer W in a shuttle SHL that is a holding member for holding the wafer W by using the not-illustrated transport arm. A concave part for mounting the wafer W is formed on a surface of the shuttle SHL. The wafer W is fixed in the concave part of the shuttle SHL by a vacuum suction or an electrostatic suction. As a result, the wafer W is held by the shuttle SHL. In the subsequent step, the wafer W is transported in the exposure system SYS in a state where the wafer W is held by the shuttle SHL. Thus, the exposure system SYS is provided with a transport line LN for transporting the shuttle SHL holding the wafer W in the exposure system SYS. Note that the alignment apparatus ALG and the transport line LN (moreover, a not-illustrated apparatus disposed in a space other than the inner space of each of the exposure chamber Ca, the load chamber Cb and the unload chamber Cc) may be disposed in an atmospheric pressure environment.

The alignment apparatus ALG executes the alignment of the wafer W held by the shuttle SHL. In order to execute the alignment, the alignment apparatus ALG is provided with a stage, a stage position measurement apparatus, a mark detect apparatus and a signal processing apparatus, for example. The stage is movable along at least one of the X axis direction, the Y axis direction, the Z axis direction, the θX direction, the θY direction and the θZ direction while holding the shuttle SHL that holds the wafer W. The stage position measurement apparatus measures the position of the stage. The mark detect apparatus detects an alignment mark AM formed on a scribe line between the plurality of shot areas S on the surface of the wafer W (moreover, a not-illustrated index (for example, an index mark that is formed on an index plate disposed in the alignment apparatus ALG), if needed). The alignment mark AM is a two-dimensional grating including a grating pattern formed to arrange in the X axis direction and a grating pattern formed to arrange in the Y axis direction, for example. The detection of the alignment mark AM may be a detection based on an image processing method (for example, FIA (Field Image Alignment) method) or may be a detection based on a diffracted light interference method. The signal processing apparatus calculates a position (for example, a position in a stage coordinate system) of the alignment mark AM on the basis of a detection result of the mark detect apparatus and a measurement result of the stage position measurement apparatus. Moreover, the signal processing apparatus executes a calculation based on an EGA (Enhanced Global Alignment) method on the basis of a calculation result of the position of the alignment mark AM, for example. As a result, the signal processing apparatus calculates a relationship between an actual position of the alignment mark AM and a designed position of the alignment mark AM (namely, a relationship between an actual position of the shot area S and a designed position of the shot area S). The result of the alignment executed by the alignment apparatus ALG is outputted to each exposure apparatus EX via a network NET that connects the alignment apparatus ALG and each exposure apparatus EX.

The shuttle SHL that holds the wafer W to which the alignment is already executed is transported to each exposure apparatus EX via the transport line LN. In order to transport the shuttle SHL, the transport line LN is provided with a guide member LNa, a shuttle carrier LNb and a shuttle carrier LNc. The guide member LNa is an elongate member that is disposed between the exposure apparatuses EX1 to EX5 and the exposure apparatuses EX6 to EX10 and that extends along the arrangement direction (the Y axis direction in the example illustrated in FIG. 1) of the exposure apparatuses EX1 to EX5 (alternatively, the exposure apparatuses EX6 to EX10). Each of the shuttle carriers LNb and LNc is movable along the guide member LNa. Each of the shuttle carriers LNb and LNc is provided with a not-illustrated housing shelf for housing the plurality of shuttles SHL. For example, each of the shuttle carriers LNb and LNc is provided with the not-illustrated housing shelf for housing the shuttles SHL the number of which is same as the number (5 in the example illustrated in FIG. 1) of the exposure apparatuses EX arranged in line. The shuttle carriers LNb is configured to deliver and receive the shuttle SHL that holds the wafer W from and to each of the exposure apparatuses EX1 to EX5 while moving along the guide member LNa. The shuttle carriers LNc is configured to deliver and receive the shuttle SHL that holds the wafer W from and to each of the exposure apparatuses EX6 to EX10 while moving along the guide member LNa.

Next, one example of an operation of transporting the shuttle SHL to each exposure apparatus EX via the transport line LN will be described. Firstly, the shuttle carrier LNb that does not yet house the shuttle SHL moves to the inside of the alignment apparatus ALG by moving along the guide member LNa one portion of which is disposed in the alignment apparatus ALG. Then, five shuttles SHL each of which holds the wafer W to which the alignment is already executed are housed in the shuttle carrier LNb by the not-illustrated transport arm of the alignment apparatus ALG. Then, the shuttle carrier LNb moves to a position that faces the load chamber Cb1 of the exposure apparatus EX1. Then, one of the five shuttles SHL housed in the shuttle carrier LNb is carried into the load chamber Cb1 through a shutter Cco (see FIG. 2) formed at an outer surface of the load chamber Cb1 by a not-illustrated transport arm disposed in the load chamber Cb1. The space in the load chamber Cb1 is the atmospheric pressure space during a period when the shuttle SHL is carried into the load chamber Cb1. Then, same operation is executed in order between the shuttle carrier LNb and the load chambers Cb2 to Cb5 with the movement of the shuttle carrier LNb along the guide member LNa. Moreover, same operation is executed in order between the shuttle carrier LNc and the load chambers Cb6 to Cb10.

Then, the inner space in the load chamber Cb1 is evacuated so that the space in the load chamber Cb1 becomes the vacuum space. Then, the shuttle SHL in the load chamber Cb1 is carried into the exposure chamber Ca1 through a not-illustrated shutter formed at a border between the load chamber Cb1 and the exposure chamber Ca1 by the not-illustrated transport arm disposed in at least one of the load chamber Cb1 and the exposure chamber Ca1. Same operation is executed between the load chambers Cb2 to Cb10 and the exposure chambers Ca2 to Ca10, respectively. As a result, the wafer W held by the shuttle SHL is exposed in each of the exposure chambers Ca1 to Ca10.

When the exposure of the wafer W in the exposure chamber Ca1 is completed, the shuttle SHL in the exposure chamber Ca1 is carried into the unload chamber Cc1 through a not-illustrated shutter formed at a border between the unload chamber Cc1 and the exposure chamber Ca1 by the not-illustrated transport arm disposed in at least one of the unload chamber Cc1 and the exposure chamber Ca1. The space in the unload chamber Cc1 is the vacuum space during a period when the shuttle SHL is carried into the unload chamber Cc1. Same operation is executed between the unload chambers Cc2 to Cc10 and the exposure chambers Ca2 to Ca10, respectively.

Then, the shuttles SHL in the unload chambers Cc1 to Cc5 are carried out to the shuttle carrier LNb. Here, the shuttle carrier LNb carries the shuttles SHL into the load chambers Cb1 to Cb5 in order. Therefore, the shuttle carrier LNb houses no shuttle SHL when the shuttle carrier LNb finishes carrying the shuttle SHL into the load chamber Cb5. Thus, carrying out the shuttle SHL to the shuttle carrier LNb is executed from the unload chamber Cc5 to the unload chamber Cc1 in order, in order to reduce an unnecessary movement of the shuttle carrier LNb. Specifically, the space in the unload chamber Cc5 turns into the atmospheric space after the shuttle SHL is carried into the unload chamber Cc5. Then, the shuttle SHL in the unload chamber Cc5 is carried out to the shuttle carrier LNb through a shutter Cco (see FIG. 2) formed at an outer surface of the unload chamber Cc5 by a not-illustrated transport arm disposed in the unload chamber Cc5. Same operation is executed in order between the shuttle carrier LNb and the unload chambers Cc4 to Cc1. Moreover, carrying out the shuttle SHL to the shuttle carrier LNc is executed from the unload chamber Cb10 to the unload chamber Cb6 in order.

Then, each of the shuttle carriers LNb and LNc that holds the shuttles SHL holding the exposed wafers W moves to the inside of the alignment apparatus ALG. Then, the shuttles SHL housed in each of the shuttle carriers LNb and LNc are carried out from each of the shuttle carriers LNb and LNc by the not-illustrated transport arm of the alignment apparatus ALG. Then, the wafer W is detached from the shuttle SHL by the not-illustrated transport arm of the alignment apparatus ALG. Then, the detached wafer W is carried out to the coater/developer via the transport truck TR.

(1-2) Structure of Exposure Apparatus EX

Figure 2:
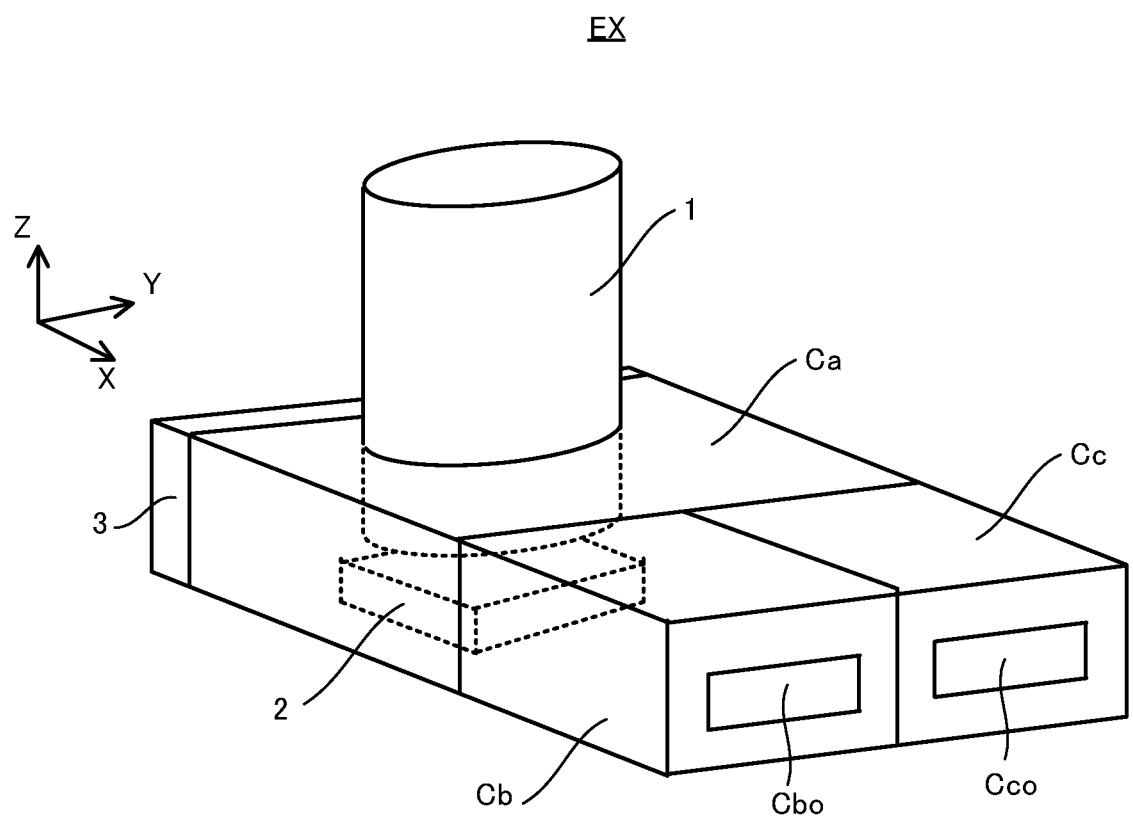
FIG. 2 is a perspective view that illustrates an exterior of an exposure apparatus of the exposure system.
Figure 3:
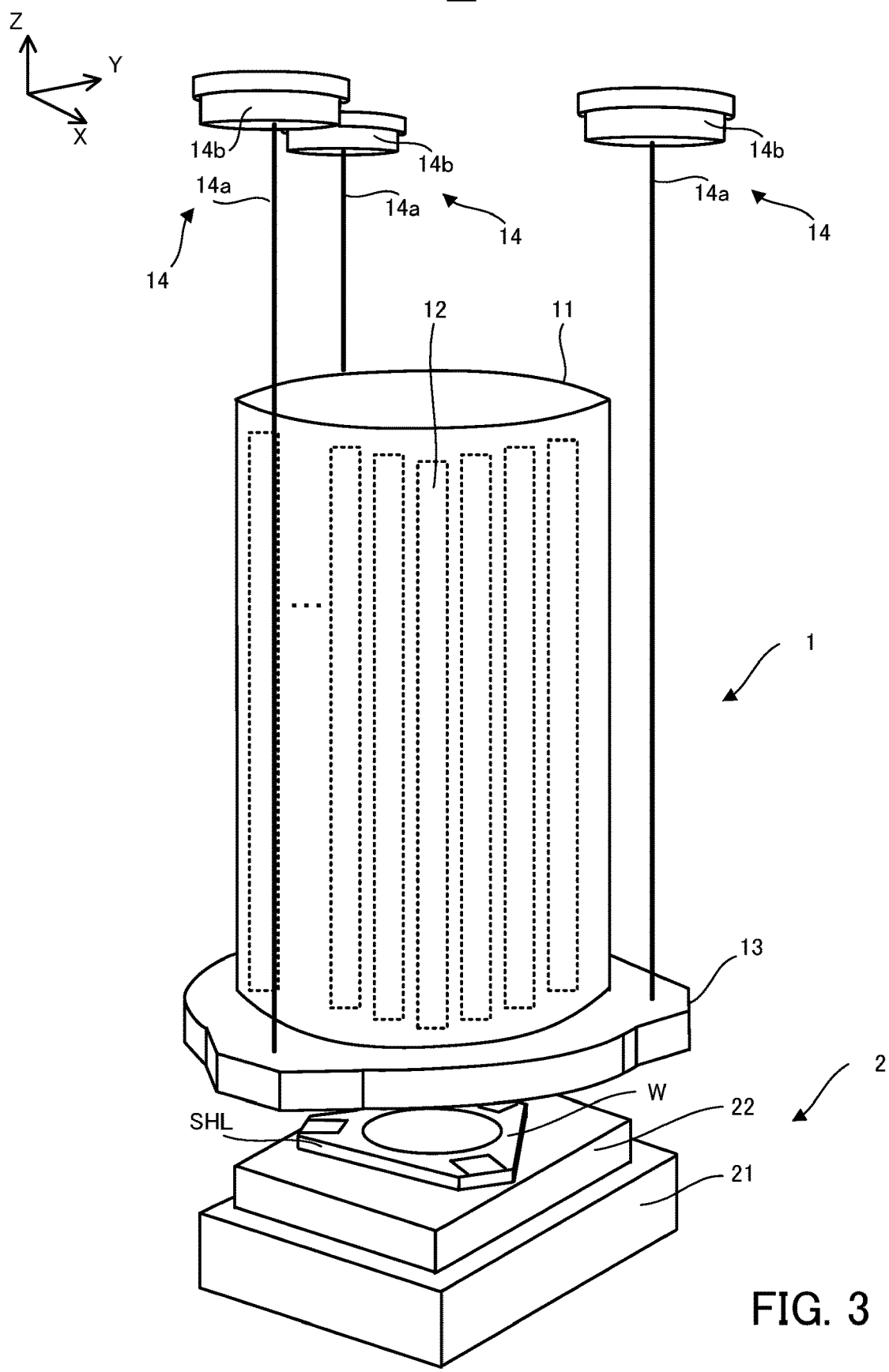
FIG. 3 is a perspective view that illustrates an exterior of an electron beam irradiation apparatus and a stage apparatus of the exposure apparatus.
Figure 4:
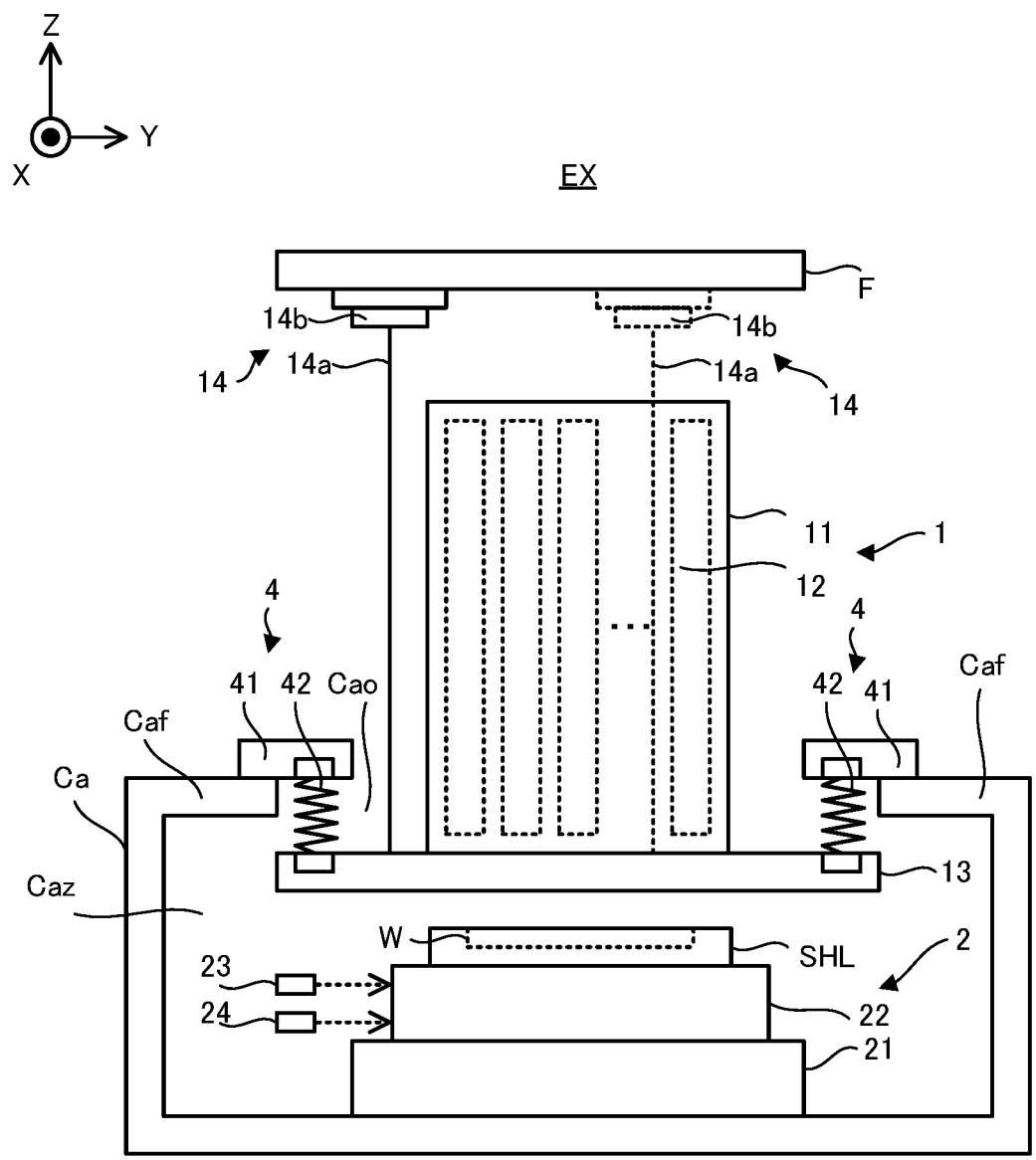
FIG. 4 is a cross-sectional view that illustrates a cross-sectional surface of the electron beam irradiation apparatus and the stage apparatus of the exposure apparatus.
Figure 5:
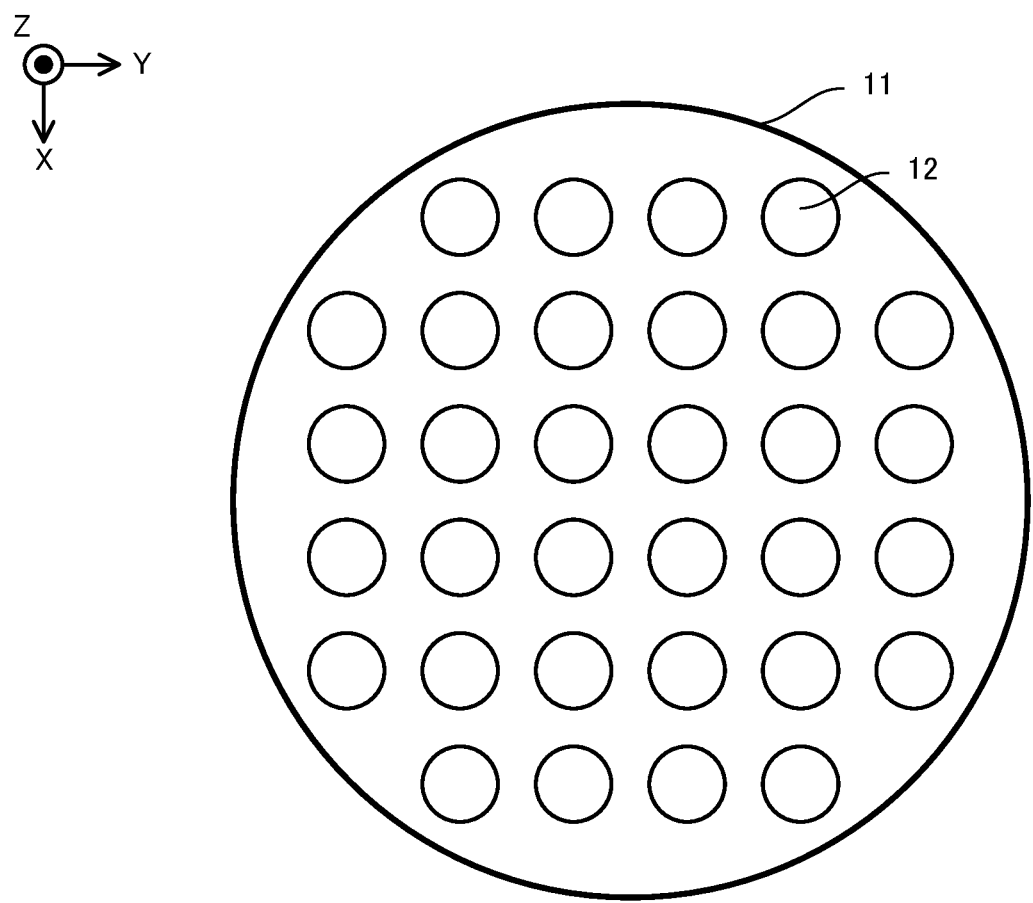
FIG. 5 is a planar view that illustrates one example of an arrangement of a plurality of electron beam optical systems (optical system columns) in a barrel of the electron beam irradiation apparatus.

Next, with reference to FIG. 2 to FIG. 5, a structure of the exposure apparatus EX will be described more in detail. FIG. 2 is a perspective view that illustrates an exterior of the exposure apparatus EX. FIG. 3 is a perspective view that illustrates an exterior of an electron beam irradiation apparatus 1 and a stage apparatus 2 of the exposure apparatus EX. FIG. 4 is a cross-sectional view that illustrates a cross-sectional surface of the electron beam irradiation apparatus 1 and the stage apparatus 2 of the exposure apparatus EX. FIG. 5 is a planar view that illustrates one example of an arrangement of a plurality of electron beam optical systems (namely, optical system columns) 12 in a barrel 11 of the electron beam irradiation apparatus 1.

As illustrated in FIG. 2 to FIG. 4, the exposure apparatus EX is provided with the electron beam irradiation apparatus 1, the stage apparatus 2 and a control apparatus 3 (note that the control apparatus 3 is not illustrated in FIG. 3 and FIG. 4). The electron beam irradiation apparatus 1 is configured to irradiate the wafer W held by the stage apparatus 2 with the electron beam EB. The stage apparatus 2 is movable while holding the wafer W. The control apparatus 3 controls the operation of the exposure apparatus EX.

One portion of the electron beam irradiation apparatus 1 is disposed in the exposure chamber Ca. In an example illustrated in FIG. 2 and FIG. 4, a lower end part of the below described barrel 11 of the electron beam irradiation apparatus 1 (namely, one portion of the electron beam irradiation apparatus 1 that is located at the stage apparatus 2 side) is disposed in the exposure chamber Ca. Moreover, whole of the stage apparatus 2 is disposed in the exposure chamber Ca. However, whole of the electron beam irradiation apparatus 1 may be disposed in the exposure chamber Ca.

The electron beam irradiation apparatus 1 is provided with the cylindrical barrel 11. An inner space in the barrel 11 becomes the vacuum space during a period when the electron beam EB is irradiated. Specifically, the inner space in the barrel 11 is connected to a chamber space Caz in the exposure chamber Ca via a lower open end of the barrel 11 (namely, an opening through which the electron beam EB is allowed to pass). Thus, the inner space in the barrel 11 becomes the vacuum space by the evacuation of the chamber space Caz.

Moreover, the electron beam irradiation apparatus 1 is provided with a metrology frame 13 for supporting the barrel 11 from below. The metrology frame 13 includes an annular plate member on which three projecting parts are formed at an outer periphery part with the central angle at an interval of 120 degrees as illustrated in FIG. 3. An lowest end part of the barrel 11 is a small diameter part having a diameter that is smaller than that of an upper part that is above the lowest end part of the barrel 11. A border part between the lowest end part of the barrel 11 and the upper part of the barrel 11 is a step part. The lowest end part is inserted into a circular opening of the metrology frame 13. Moreover, a bottom surface of the step part contacts with an upper surface of the metrology frame 13. As a result, the barrel 11 is supported by the metrology frame 13 from below.

Moreover, the electron beam irradiation apparatus 1 is provided with three suspension support mechanisms 14 for supporting the metrology frame 13. The metrology frame 13 is suspended and supported from an outer frame F (see FIG. 4) via the three suspension support mechanisms 14 a lower ends of which are connected to the above described three projection parts. Each suspension support mechanism 14 is provided with a wire 14a one end of which is connected to the metrology frame 13 and a passive vibration isolation pad 14b that connects the other end of the wire 14a and the outer frame F. The vibration isolation pad 14b includes at least one of an air dumper and a coil spring, for example. Thus, the vibration isolation pad 14b prevents a vibration of the outer frame F from being transmitted to the metrology frame 13 (furthermore, the barrel 11).

As described above, one portion of the electron beam irradiation apparatus 1 is disposed in the exposure chamber Ca. The metrology frame 13 corresponds to one portion of the electron beam irradiation apparatus 1 that is disposed in the exposure chamber Ca. Moreover, one portion of the barrel 11 (specifically, the lower end part) also corresponds to one portion of the electron beam irradiation apparatus 1 that is disposed in the exposure chamber Ca. In order to dispose one portion of the barrel 11 and the metrology frame 13 in the exposure chamber Ca, an opening Cao is formed at an upper surface of the exposure chamber Ca as illustrated in FIG. 4. Namely, the exposure chamber Ca includes, as one portion of a partition wall of the exposure chamber Ca, a circular-shaped (alternatively, a frame-like-shaped) flange part Caf for defining the opening Cao. One portion of the barrel 11 and the metrology frame 13 are inserted into the exposure chamber Ca via the opening Cao. Moreover, the flange part Caf and metrology frame 13 are connected (in other words, coupled) via a circular-shaped (alternatively, a frame-like-shaped) connecting part 4. The connecting part 4 is provided with a circular-shaped (alternatively, a frame-like-shaped) plate 41 that is disposed on an upper surface of the flange part Caf and a circular-shaped (alternatively, a frame-like-shaped) bellows 42 that connects the plate 41 and the metrology frame 13 to surround the barrel 11. An outer periphery part of a lower surface of the plate 41 is connected to the upper surface of the flange part Caf throughout the outer periphery. An upper part of the bellows 42 is connected to an inner periphery part of the lower surface of the plate 41 throughout the outer periphery. A lower part of the bellows 42 is connected to the upper surface of the metrology frame 13 throughout the outer periphery. Thus, an airtightness of a space surrounded by the exposure chamber Ca, the plate 41, the bellows 42, the metrology frame 13 and the barrel 11 is ensured. Namely, the exposure chamber Ca, the plate 41, the bellows 42, the metrology frame 13 and the barrel 11 forms the vacuum space in which the stage apparatus 2 (especially, the wafer W held by the stage apparatus 2) is housed. Moreover, the bellows 42 prevents a vibration (especially, a vibration in the Z axis direction) of exposure chamber Ca from being transmitted to the metrology frame 13 (furthermore, the barrel 11).

The electron beam irradiation apparatus 1 is further provided with, in the barrel 11, the plurality of electron beam optical systems (in other words, optical system columns) 12 that are arranged to have a predetermined positional relationship in an XY plane. Namely, the exposure apparatus EX is what we call a multi-column type of exposure apparatus. For example, as illustrated in FIG. 5, the plurality of electron beam optical systems 12 are arranged in a matrix in the XY plane. Alternatively, the plurality of electron beam optical systems 12 may be arranged in an array (namely, in line) in the XY plane. The below described description uses an example in which the electron beam irradiation apparatus 1 is provided with N (note that N is an integer number equal to or larger than 2) electron beam optical systems 12. N may be dozens to one hundred and dozens (for example, 88 to 100), however, N may be another number. Each electron beam optical system 12 is configured to irradiate the electron beam EB independently.

The stage apparatus 2 is disposed below (namely, at a −Z side from) the electron beam irradiation apparatus 1. The stage apparatus 2 is provided with a surface plate 21 and a stage 22. The surface plate 21 is disposed on a bottom surface of the exposure chamber Ca. The stage 22 is disposed on the surface plate 21. A not-illustrated vibration isolation apparatus for preventing a vibration of the surface plate 21 from being transmitted to the stage 22 is disposed between the surface plate 21 and the stage 22. The stage 22 is configured to hold the shuttle SHL holding the wafer W. Therefore, the wafer W is exposed by the electron beam EB irradiated from the electron beam irradiation apparatus 1 in a state where the wafer W is held by the shuttle SHL.

The stage 22 is movable along at least one of the X axis direction, the Y axis direction, the Z axis direction, the θX direction, the θY direction and the θZ direction while holding the shuttle SHL, under the control of the control apparatus 3. In order to move the stage 22, the stage apparatus 2 is provided with a stage driving system 23 (see FIG. 4). The stage driving system 23 moves the stage 22 by using any motor (for example, a linear motor), for example. Moreover, the stage apparatus 2 is provided with a position measuring equipment 24 for measuring a position of the stage 22. The position measuring equipment 24 includes at least one of an encoder and a laser interferometer, for example. Note that the stage driving system 23 and the position measuring equipment 24 are not illustrated in FIG. 2 and FIG. 3 and are illustrated only in FIG. 4 for the purpose of simplifying the drawings. Although FIG. 4 illustrates the cross-sectional surface of the exposure apparatus EX, FIG. 4 may not illustrate the cross-sectional surface of the stage driving system 23 and the position measuring equipment 24.

(1-3) Structure of Electron Beam Optical System 12

Figure 6:
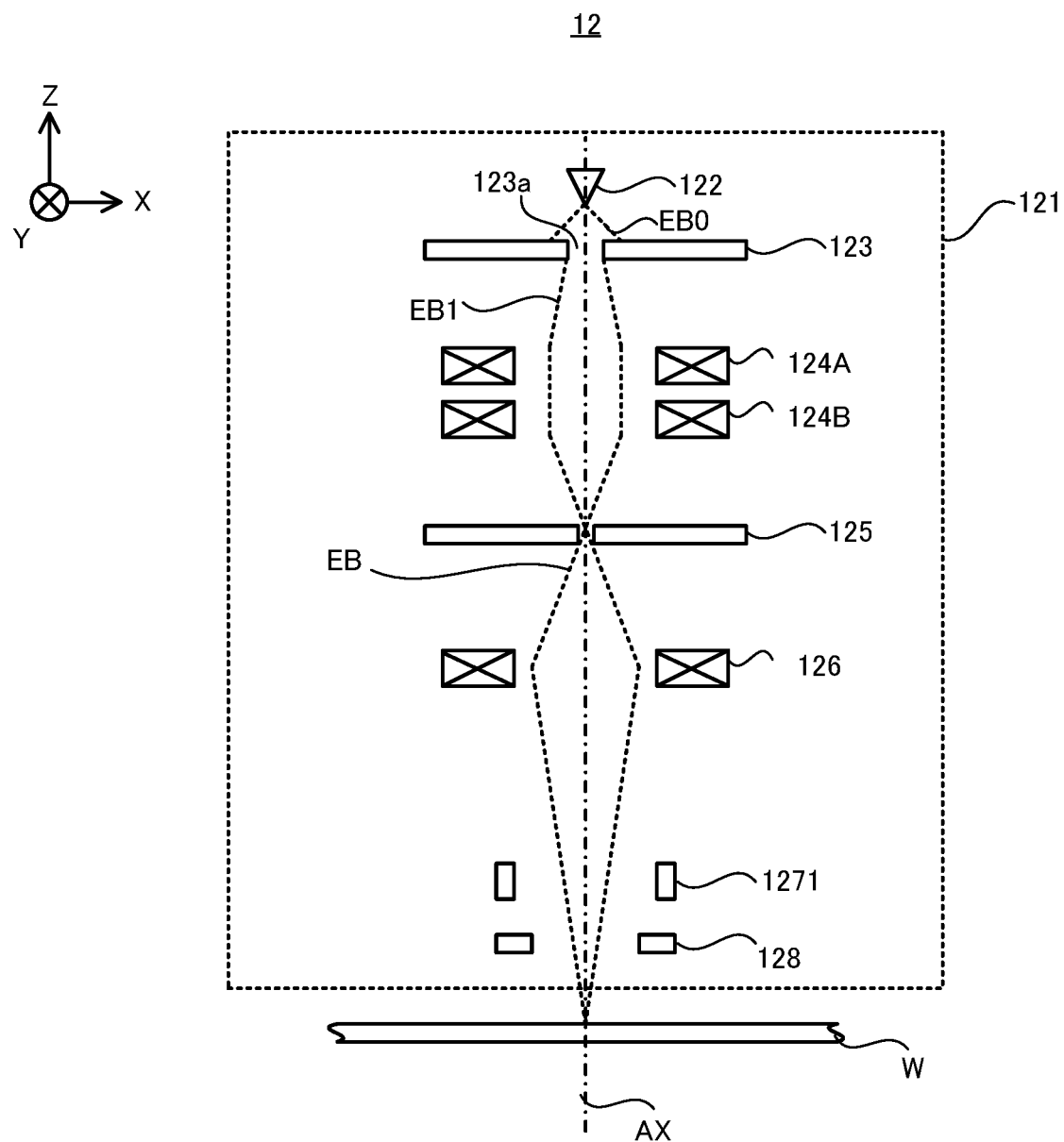
FIG. 6 is a cross-sectional view that illustrates a cross-sectional surface (a cross-sectional surface including an optical axis of the electron beam optical system) of the electron beam optical system.
Figure 7:
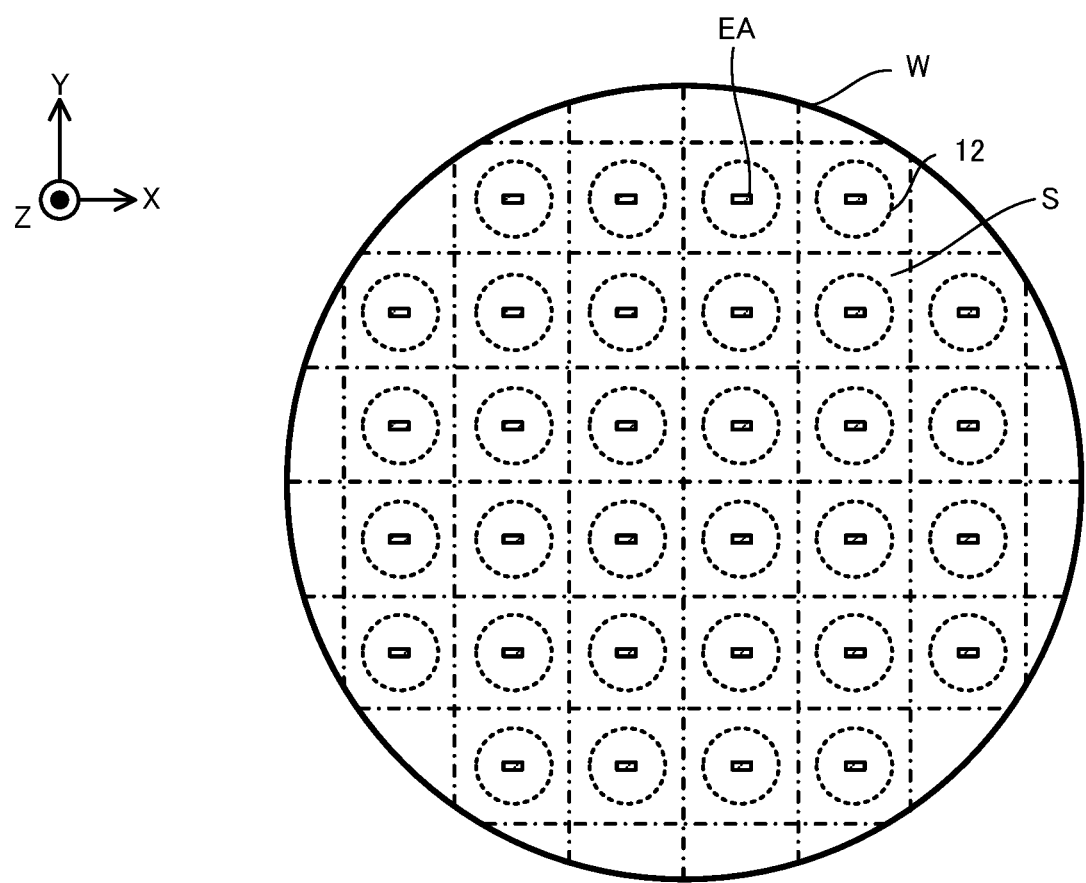
FIG. 7 is a planar view that illustrates irradiation positions (irradiation areas) of the electron beams from the plurality of electron beam optical systems on a wafer.

Next, with reference to FIG. 6, a structure of the electron beam optical system 12 will be described. FIG. 6 is a cross-sectional view that illustrates a cross-sectional surface (a cross-sectional surface including the optical axis AX of the electron beam optical system 12) of the electron beam optical system 12.

As illustrated in FIG. 6, the electron beam optical system 12 is provided with a cylindrical housing (in other words, a column cell) 121 that is configured to shield against the electromagnetic field. Moreover, the electron beam optical system 12 is provided with an electron gun 122, a first shaping diaphragm 123, a first shaping lens 124A, a second shaping lens 124B, a second shaping diaphragm 125 and an objective lens 126 in the housing 121. The first shaping diaphragm 123, the first shaping lens 124A, the second shaping lens 124B, the second shaping diaphragm 125 and the objective lens 126 are arranged in this order below (namely, at the −Z side from) the electron gun 122 to have a predetermined positional relationship The electron gun 122 emits an electron beam EB0 having a predetermined acceleration voltage (for example, 50 keV). The electron beam EB0 passes through an aperture 123a of the first shaping diaphragm 123. As a result, the electron beam EB0 is shaped into an electron beam EB1 having a cross-sectional surface corresponding to a shape of the aperture 123a. Then, the electron beam EB1 forms an image on the second shaping diaphragm 125 (especially, an aperture 125a) by the first shaping lens 124A and the second shaping lens 124B. Each of the first shaping lens 124A and the second shaping lens 124B is an electromagnetic lens (in other words, an electron lens), for example. As a result, the electron beam EB1 is shaped into the electron beam EB having a cross-sectional surface based on a degree of an overlap of the first shaping diaphragm 123 and the second shaping diaphragm 125 (namely, a degree of an overlap of the aperture 123a and the aperture 125a). Alternatively, when the aperture 125a of the second shaping diaphragm 125 is an aperture corresponding to a pattern to be drawn on or transferred to the wafer W, the electron beam EB1 is shaped into the electron beam EB based on the aperture 125a of the second shaping diaphragm 125 (namely, the electron beam EB that allows a collective exposure of the pattern).

The electron beam EB passing through the second shaping diaphragm 125 is irradiated on the wafer W as the electron beam EB for exposing the wafer W. At this stage, the objective lens 126 allows the electron beam EB to form an image on the surface of the wafer W with a predetermined reduction magnification y. The objective lens 126 is an electromagnetic lens (in other words, an electron lens), for example.

Moreover, the electron beam optical system 12 is provided with a deflector 1271 below the second shaping diaphragm 125.

The deflector 1271 is an electromagnetic deflector that is provided with at least one pair of first coils 1271X (not illustrated in FIG. 6 for the purpose of simplifying the illustration) that are disposed to sandwich the optical axis AX along the Y axis direction and at least one pair of second coils 1271Y (not illustrated in FIG. 6 for the purpose of simplifying the illustration) that are disposed to sandwich the optical axis AX along the X axis direction. A driving electrical current that is controllable under the control of the control apparatus 3 is supplied to the pair of the first coils 1271X. As a result, the deflector 1271 allows the electron beam EB to be deflected in the X axis direction by using a magnetic field generated by the pair of the first coils 1271X. As a result, the deflector 1271 is configured to control an irradiation position of the electron beam EB (for example, the irradiation position on the wafer W and a position of a below descried irradiation area EA) in the X axis direction. Moreover, a driving electrical current that is controllable under the control of the control apparatus 3 is supplied to the pair of the second coils 1271Y. As a result, the deflector 1271 allows the electron beam EB to be deflected in the Y axis direction by using a magnetic field generated by the pair of the second coils 1271Y. As a result, the deflector 1271 is configured to control the irradiation position of the electron beam EB in the Y axis direction.

Note that the deflector 1271 may be an electrostatic deflector that is provided with a pair of first electrode plates that are disposed to sandwich the optical axis AX along the X axis direction and a pair of second electrode plates that are disposed to sandwich the optical axis AX along the Y axis direction, instead of the pair of the first coils 1271X and the pair of the second coils 1271Y. In this case, an electrical voltage that is controllable under the control of the control apparatus 3 is applied to each of the pair of the first electrode plates and the pair of the second electrode plates. As a result, the deflector 1271 is configured to control the irradiation position of the electron beam EB in the X axis direction by using an electric field generated between the pair of the first electrode plates and to control the irradiation position of the electron beam EB in the Y axis direction by using an electric field generated between the pair of the second electrode plates.

Figure 8:
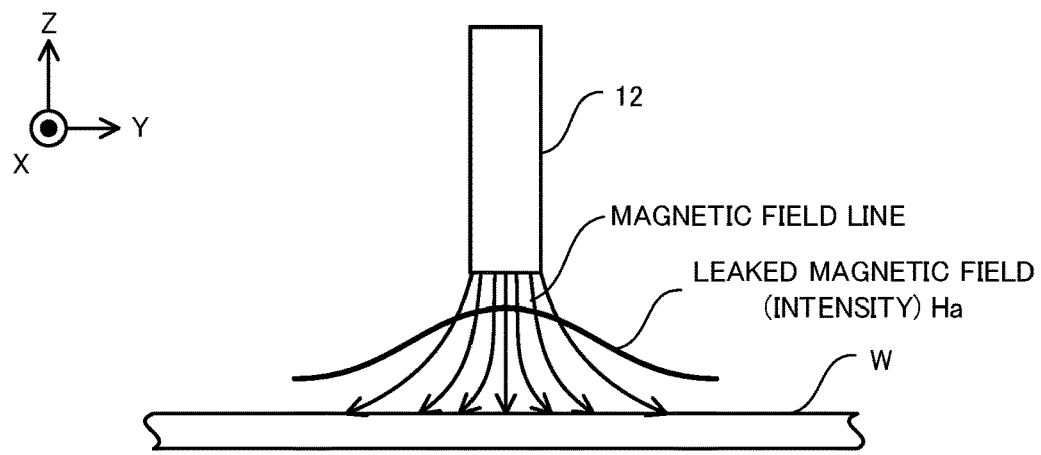
FIG. 8 is a cross-sectional view that conceptually illustrates a leaked magnetic field from the electron beam optical system.

The above described irradiation of the electron beam EB is executed by the plurality of electron beam optical systems 12 in parallel. Here, the plurality of electron beam optical systems 12 correspond to the plurality of shot areas S on the wafer W one-on-one. However, the number of the electron beam optical systems 12 may be larger than the number of the shot areas S. Each electron beam optical system 12 is allowed to irradiate the above described electron beam EB in the quadrangular (for example, 100 micrometer×20 micrometer) irradiation area EA. Thus, as illustrated in FIG. 8, the plurality of electron beam optical systems 12 are allowed to irradiate the plurality of electron beams EB to the plurality of irradiation areas EA set on the plurality of shot areas S on the wafer W, respectively, at a time. When the plurality of electron beam optical systems 12 irradiate the electron beams EB while moving the wafer W relative to these irradiation areas EA, the plurality of shot areas S on the wafer W are exposed in parallel. As a result, a pattern that is smaller than a resolution limit of an exposure apparatus in a comparison example for exposing the wafer by an ultraviolet light is formed with a relatively high throughput.

Moreover, the electron beam optical system 12 is provided with a pair of reflected electron detect apparatuses 128 below the objective lens 126. The pair of reflected electron detect apparatuses 128 are disposed to sandwich the optical axis AX in the X axis direction. Note that the electron beam optical system 12 is provided with a pair of reflected electron detect apparatuses 129 that are disposed to sandwich the optical axis AX in the Y axis direction below the objective lens 126, although they are not illustrated in FIG. 6 for the purpose of simplifying the illustration. Each of the reflected electron detect apparatuses 128 and 129 is a semiconductor type of reflected electron detect apparatus using a semiconductor having a p-n junction or a pin junction. Each of the pair of reflected electron detect apparatuses 128 and the pair of reflected electron detect apparatuses 129 detect the above described alignment mark AM (moreover, a not-illustrated index (for example, an index mark that is formed on an index plate disposed in the exposure apparatus EX), if needed) under the control of the control apparatus 3. Specifically, each of the pair of reflected electron detect apparatuses 128 and the pair of reflected electron detect apparatuses 129 detect a reflected component (for example, a reflected electron) of the electron beam EB generated from the alignment mark AM. A detection result of the pair of reflected electron detect apparatuses 128 and the pair of reflected electron detect apparatuses 129 is outputted to the control apparatus 3. The control apparatus 3 calculates the position (for example, a position in a stage coordinate system) of the alignment mark AM on the basis of the detection result of the pair of reflected electron detect apparatuses 128 and the pair of reflected electron detect apparatuses 129 and a measurement result of the position measuring equipment 24. Moreover, the control apparatus 3 executes a calculation based on an EGA (Enhanced Global Alignment) method on the basis of a calculation result of the position of the alignment mark AM. As a result, the control apparatus 3 calculates a relationship between an actual position of the alignment mark AM and a designed position of the alignment mark AM (namely, a relationship between an actual position of the shot area S and a designed position of the shot area S).

(2) Leaked Magnetic Field from Plurality of Electron Beam Optical Systems 12

Next, with reference to FIG. 8 to FIG. 10B, an influence of a leaked magnetic field from the plurality of electron beam optical systems 12 will be described. As described above, each electron beam optical system 12 is provided with a magnetic field generator that is configured to generate the magnetic field. For example, each electron beam optical system 12 is provided with, as magnetic field generator, the first shaping lens 124A, the second shaping lens 124B, the objective lens 126 and the deflector 128.

The magnetic field generator usually generates the magnetic field in the housing 121 to control the electron beam EB. The housing 121 is usually made of a material having a relatively high magnetic permeability. Namely, the housing 121 shields against the magnetic field so that the magnetic field (in other words, magnetic field lines) generated by the magnetic field generator in the housing does not affect another electron beam optical system 12. On the other hand, a lower end part of the housing 121 is opened for irradiating the electron beam EB. Therefore, there is a possibility that the magnetic field generated by the magnetic field generator in the housing 121 leaks to the outside through an open end at the lower end part of the housing 121, although it does not easily leak to the outside through the housing 121. Here, if the open end at the lower end part of the housing 121 is closed by an object, the magnetic field generated by the magnetic field generator in the housing 121 is expected not to leak to the outside through the open end at the lower end part of the housing 121. However, a movable object (for example, the wafer W mounted on the stage 22) is disposed below the housing 121 in some case. In this case, a gap is formed between the lower end part of the housing 121 and the wafer W in order to realize a smooth movement of the wafer W. Thus, the magnetic field generated by the magnetic field generator in the housing 121 leaks to the outside of the housing 121 through this gap. As a result, as illustrated in FIG. 8, a magnetic field (hereinafter, it is referred to as a "leaked magnetic field") Ha leaked from the electron beam optical system 12 exists in a space below the electron beam optical system 12 (in the present embodiment, a space between the electron beam optical system 12 and the wafer W). Note that the leaked magnetic field Ha illustrated in FIG. 8 represents an intensity of the leaked magnetic field Ha (namely, a density of the magnetic field lines or a magnitude of a magnetic flux density) for convenience.

Figure 9A:
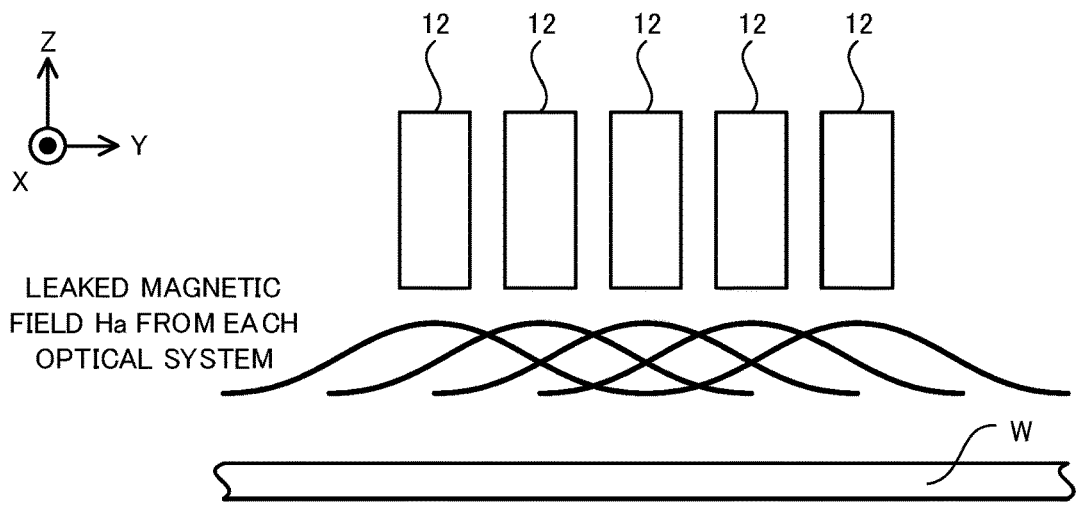
FIG. 9A is a cross-sectional view that conceptually illustrates leaked magnetic fields from the plurality of electron beam optical systems and FIG. 9B is a cross-sectional view that conceptually illustrates a leaked magnetic field that corresponds to a magnetic field in which the leaked magnetic fields from the plurality of electron beam optical systems are combined.
Figure 9B:
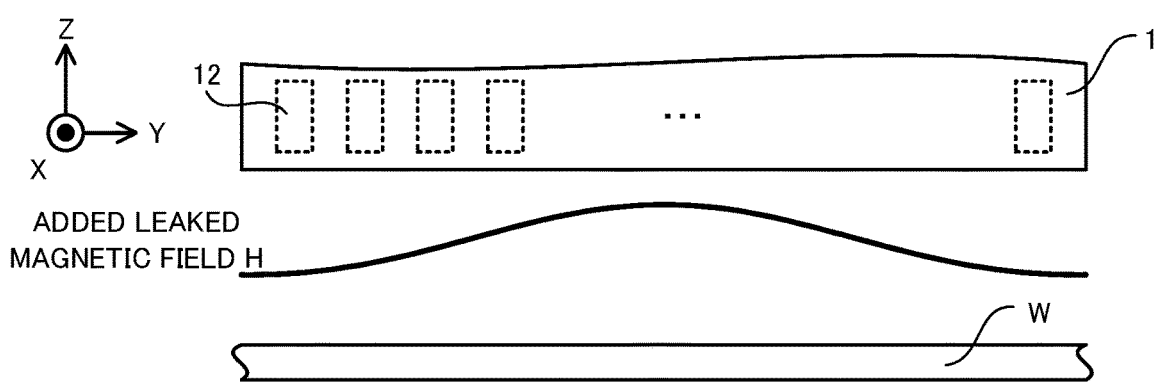

This leaked magnetic field Ha is leaked from each of the plurality of electron beam optical systems 12 as illustrated in FIG. 9A. Thus, a leaked magnetic field H that corresponds to a magnetic field in which the plurality of leaked magnetic fields Ha leaked from the plurality of electron beam optical systems 12 are combined exists in the space below the electron beam optical system 12 (namely, a space above the wafer W). Especially, as illustrated in FIG. 9A, when polarities of the plurality of leaked magnetic fields Ha leaked from the plurality of electron beam optical systems 12 are same, the plurality of leaked magnetic fields Ha strengthen one another. Thus, as illustrated in FIG. 9B, the leaked magnetic field H having the intensity that becomes larger from the outer side to an inner side of the electron beam irradiation apparatus 1 (namely, the leaked magnetic field H having a sloped intensity in the space above the wafer W) remains in the space below the electron beam irradiation apparatus 1.

Figure 10A:
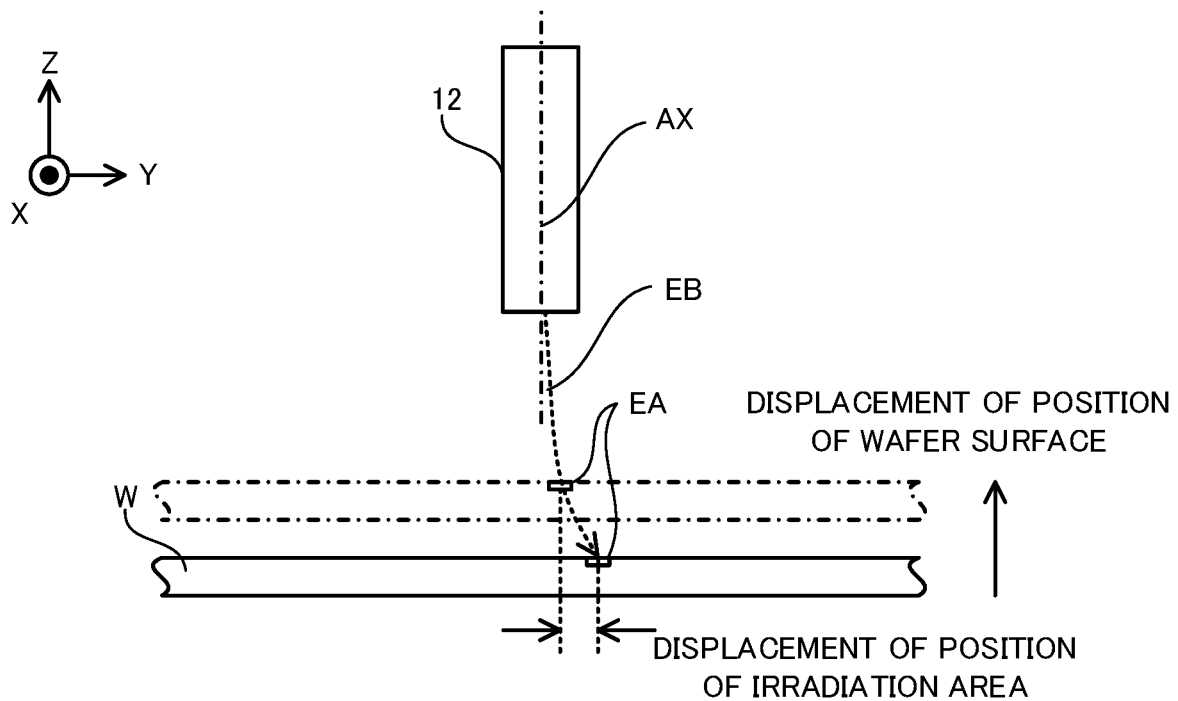
FIG. 10B is a cross-sectional view that illustrates an aspect an incident electron beam to the wafer.

Here, when the electron beam EB that propagates in parallel with the optical axis AX enters the wafer W above which the leaked magnetic field H having the sloped intensity remains, the electron beam EB propagates to be inclined with respect to the optical axis AX of the electron beam optical system 12 (namely, the Z axis direction) due to the influence of the leaked magnetic field H. Moreover, an inclined amount of the electron beam EB with respect to the optical axis AX (namely, the Z axis direction) is proportional to the magnetic field in the space in which the electron beam EB propagates. Therefore, when the leaked magnetic field H remains in the space above the wafer W, there is a possibility that an incident angle of the electron beam EB with respect to the surface of the wafer W is not zero (namely, the electron beam EB enters the surface of the wafer W obliquely) as illustrated in FIG. 10A. As a result, as illustrated in FIG. 10A, when the surface of the wafer W is displaced along the Z axis direction (namely, along the optical axis AX), the position of the irradiation area EA of the electron beam EB on the wafer W is displaced. Thus, there is a possibility that the electron beam EB is not irradiated to a desired position on the wafer W. As a result, there is a possibility that an exposure accuracy of the electron beam EB deteriorates.

Figure 10B:
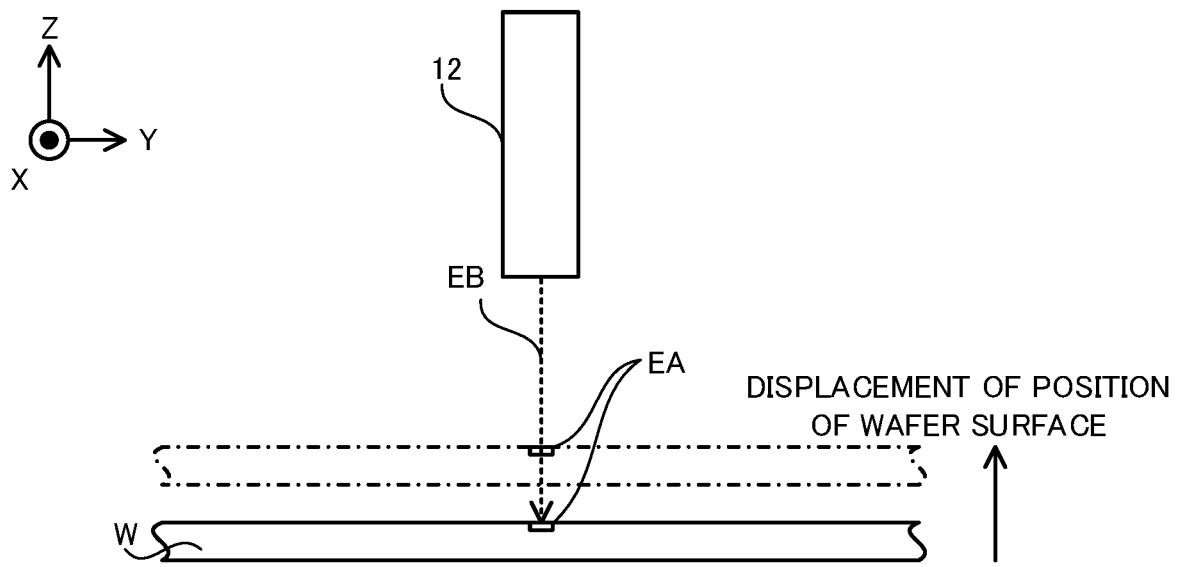

Note that FIG. 10B illustrate the electron beam EB an incident angle of which with respect to the surface of the wafer W is zero (namely, that enters the surface of the wafer W vertically) for the reference. In this case, even when the surface of the wafer W is displaced along the Z axis direction, the position of the irradiation area EA of the electron beam EB on the wafer W is not displaced.

Thus, the control apparatus 3 in the present embodiment executes a magnetic field control operation for reducing the above described influence of the leaked magnetic field H. Specifically, the control apparatus 3 executes the magnetic field control operation to reduce the displacement of the position of the irradiation area EA by reducing the inclination of the electron beam EB (specifically, the inclination with respect to the optical axis AX) due to the influence of the leaked magnetic field H. Especially, the control apparatus 3 focuses that the magnetic field generator of the electron beam optical system 12 includes a static magnetic field generator that need not dynamically control the magnetic field or has a small possibility to control the magnetic field during a period when the wafer W is exposed and executes the magnetic field control operation to reduce the influence of the leaked magnetic field H by controlling the static magnetic field generator. Note that each of the first shaping lens 124A, the second shaping lens 124B and the objective lens 126 is the static magnetic field generator in the present embodiment, for example.

(3) Magnetic Field Control Operation

Next, the magnetic field control operation executed by the control apparatus 3 will be described. As described above, the magnetic field control operation is an operation for reducing the influence of the leaked magnetic field H. Here, an operation of weakening the leaked magnetic field H itself is one of the operation for reducing the influence of the leaked magnetic field H. Considering that the leaked magnetic field H corresponds to the magnetic field in which the plurality of leaked magnetic field Ha leaked from the plurality of electron beam optical systems 12 are combined, the leaked magnetic field H is expected to be weakened (namely, the influence of the leaked magnetic field H is expected to be reduced) when strengthening the plurality of leaked magnetic field Ha one another due to the combining is reduced. Namely, the leaked magnetic field H is expected to be weakened (namely, the influence of the leaked magnetic field H is expected to be reduced) when the plurality of leaked magnetic fields Ha are weakened by one another.

Thus, in the present embodiment, the control apparatus 3 controls the static magnetic field generator so that the plurality of leaked magnetic field Ha are weakened by one another. Here, as described above, when the polarities of the plurality of leaked magnetic fields Ha are same, the plurality of leaked magnetic fields Ha are strengthened by one another. Therefore, when the polarity of the leaked magnetic field Ha that is one portion of the plurality of leaked magnetic fields Ha is inverted with respect to the polarity of the leaked magnetic field Ha that is another one portion of the plurality of leaked magnetic fields Ha, the plurality of leaked magnetic field Ha are expected to be weakened by one another. Note that a state where "the polarity of the leaked magnetic field Ha that is one portion is inverted with respect to the polarity of the leaked magnetic field Ha that is another one portion" here means a relationship that the polarity of the leaked magnetic field Ha that is one portion is reversed with respect to the polarity of the leaked magnetic field Ha that is another one portion (for example, directions of the magnetic field lines are opposite to each other). Thus, the control apparatus 3 controls the static magnetic field generator so that the polarity of the leaked magnetic field Ha that is one portion of the plurality of leaked magnetic fields Ha is inverted with respect to the polarity of the leaked magnetic field Ha that is another one portion of the plurality of leaked magnetic fields Ha.

Specifically, when the polarity of the leaked magnetic field Ha leaked from one electron beam optical system 12 is inverted with respect to the polarity of the leaked magnetic field Ha leaked from another electron beam optical system 12, the leaked magnetic field Ha leaked from one electron beam optical system 12 and the leaked magnetic field Ha leaked from another electron beam optical system 12 are weakened by each other. Thus, the control apparatus 3 controls the static magnetic field generator so that each of the plurality of electron beam optical systems 12 is set to either one of an electron beam optical system 12-1 in a first state from which the leaked magnetic field Ha having a first polarity is leaked and an electron beam optical system 12-2 in a second state from which the leaked magnetic field Ha having a second polarity that is inverted with respect to the first polarity is leaked on the basis of the position of each electron beam optical system 12.

Figure 11:
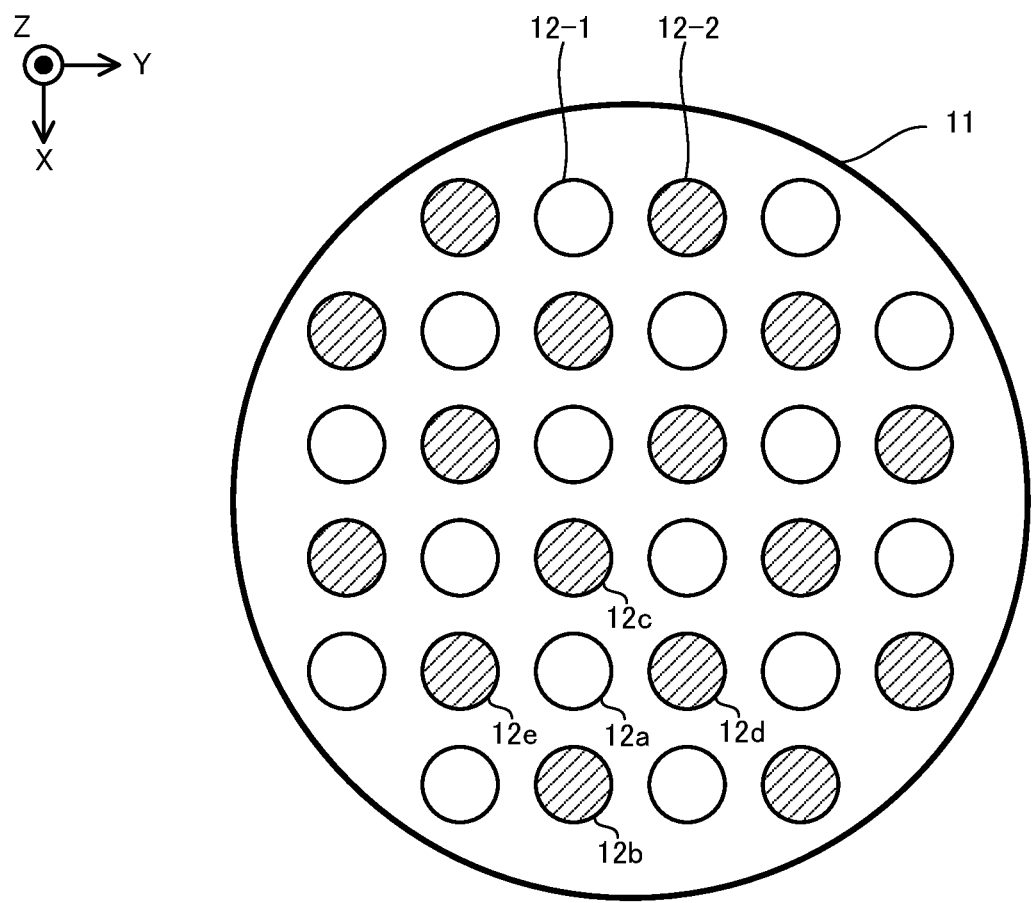
FIG. 11 is a planar view that illustrates one example of an arrangement of the electron beam optical system in which a static magnetic generator is in a first state and the electron beam optical system in which the static magnetic generator is in a second state.

In the present embodiment, the control apparatus 3 controls the static magnetic field generators of adjacent two electron beam optical systems 12 so that the leaked magnetic fields Ha having different polarities are leaked from the adjacent two electron beam optical systems 12, in order to allow the plurality of leaked magnetic fields Ha to be weakened by one another more effectively. Namely, as illustrated in FIG. 11 that is a planar view for illustrating an arrangement of the plurality of electron beam optical systems 12, the control apparatus 3 controls the static magnetic field generators of the adjacent two electron beam optical systems 12 so that one of the adjacent two electron beam optical systems 12 becomes the electron beam optical system 12-1 in the first state and another one of the adjacent two electron beam optical systems 12 becomes the electron beam optical system 12-2 in the second state. Note that the electron beam optical system 12-1 is illustrated by a white circle and the electron beam optical system 12-2 is illustrated by a hatched circle in FIG. 11.

As described above, the plurality of electron beam optical systems 12 are arranged in a matrix. Thus, when a certain electron beam optical system 12 is set to be the electron beam optical system 12-1, the control apparatus 3 sets four electron beam optical systems 12 that are adjacent to the certain electron beam optical system 12 at the +X side, the −X side, the +Y side and the −Y side from the certain electron beam optical system 12 to the electron beam optical system 12-2. For example, in an example illustrated in FIG. 11, when an electron beam optical system 12a is set to be the electron beam optical system 12-1, the control apparatus 3 sets each of 26 an electron beam optical systems 12b that is adjacent to the electron beam optical system 12a at the +X side from the electron beam optical system 12a, an electron beam optical systems 12c that is adjacent to the electron beam optical system 12a at the −X side from the electron beam optical system 12a, an electron beam optical systems 12d that is adjacent to the electron beam optical system 12a at the +Y side from the electron beam optical system 12a and an electron beam optical systems 12e that is adjacent to the electron beam optical system 12a at the −Y side from the electron beam optical system 12a to the electron beam optical system 12-2. As a result, the electron beam optical systems 12-1 and the electron beam optical systems 12-2 are arranged alternately along the X axis direction and the Y axis direction.

As described above, the plurality of electron beam optical systems 12 includes the electron beam optical system 12-1 that is a first irradiation optical system and the electron beam optical system 12-2 that is a second irradiation optical system for generating a second magnetic field (here, the leaked magnetic field Ha) having characteristics (here, it is the polarity, however, it may be another characteristics other than the polarity) different from characteristics of a first magnetic field (here, the leaked magnetic field Ha) generated by the first irradiation optical system. More specifically, the electron beam optical system 12-1 and the electron beam optical system 12-2 are distinguished on the basis of the polarity of the magnetic field generated by the static magnetic field generator. Specifically, the polarity of the magnetic field generated by the static magnetic field generator of the electron beam optical system 12-1 is inverted with respect to the polarity of the magnetic field generated by the static magnetic field generator of the electron beam optical system 12-2. Namely, the control apparatus 3 controls the static magnetic field generator of each of the plurality of the electron beam optical systems 12 so that the polarity of the magnetic field generated by the static magnetic field generator of the electron beam optical system 12-1 is inverted with respect to the polarity of the magnetic field generated by the static magnetic field generator of the electron beam optical system 12-2.

Figure 12A:
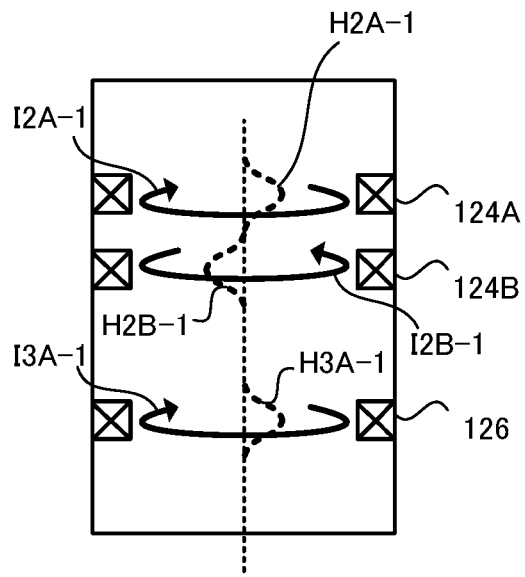
FIG. 12A is a cross-sectional view that illustrate the electron beam optical system in which the static magnetic generator is in the first state.
Figure 12B:
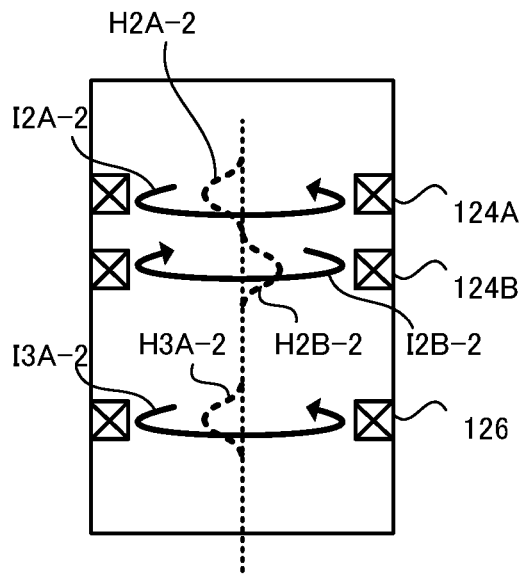
FIG. 12B is a graph that illustrate the leaked magnetic field from the electron beam optical system in which the static magnetic generator is in the first state.

Here, as described above, each electron beam optical system 12 is provided with the first shaping lens 124A, the second shaping lens 124B and the objective lens 126 as the static magnetic field generator. In this case, the control apparatus 3 controls the static magnetic field generator of each electron beam optical systems 12 so that the polarity of the magnetic field generated by one static magnetic field generator of the plurality of static magnetic field generators of the electron beam optical system 12-1 is inverted with respect to the polarity of the magnetic field generated by corresponding one static magnetic field generator of the plurality of static magnetic field generators of the electron beam optical system 12-2. Note that "the polarity of the magnetic fields are inverted" means a state where "the directions of the magnetic field lines are inverted (namely, are in a reversed or opposite relationship)". Specifically, as illustrated in FIG. 12A and FIG. 12B, the control apparatus 3 controls the first shaping lens 124A of each electron beam optical systems 12 so that the polarity of the magnetic field H2A-1 generated by the first shaping lens 124A of the electron beam optical system 12-1 is inverted with respect to the polarity of the magnetic field H2A-2 generated by the first shaping lens 124A of the electron beam optical system 12-2. Similarly, the control apparatus 3 controls the second shaping lens 124B of each electron beam optical systems 12 so that the polarity of the magnetic field H2B-1 generated by the second shaping lens 124B of the electron beam optical system 12-1 is inverted with respect to the polarity of the magnetic field H2B-2 generated by the second shaping lens 124B of the electron beam optical system 12-2. Similarly, the control apparatus 3 controls the objective lens 126 of each electron beam optical systems 12 so that the polarity of the magnetic field H3A-1 generated by the objective lens 126 of the electron beam optical system 12-1 is inverted with respect to the polarity of the magnetic field H3A-2 generated by the objective lens 126 of the electron beam optical system 12-2.

The control apparatus 3 controls an driving electrical current supplied to the static magnetic field generator in order to allow the polarity of the magnetic field generated by the static magnetic field generator of the electron beam optical system 12-1 to be inverted with respect to the polarity of the magnetic field generated by the static magnetic field generator of the electron beam optical system 12-2. Specifically, the control apparatus 3 controls the driving electrical current supplied to each of the plurality of static magnetic field generators of each electron beam optical system 12 so that a direction along which the driving electrical current flows in the static magnetic field generator of the electron beam optical system 12-1 is inverted with respect to a direction along which the driving electrical current flows in the static magnetic field generator of the electron beam optical system 12-2. Note that a state where "the directions of the driving electrical currents are inverted" means a state where "the directions of the driving electrical currents are inverted (namely, reversed or opposite) in any plane including a current path in the static magnetic field generator". Specifically, as illustrated in FIG. 12A and FIG. 12B, the control apparatus 3 controls the driving electrical current supplied to the first shaping lens 124A of each electron beam optical system 12 so that the direction of a driving electrical current 12A-1 flowing in the first shaping lens 124A (namely, a coil, same applies to the following description) of the electron beam optical system 12-1 is inverted with respect to the direction of a driving electrical current 12A-2 flowing in the first shaping lens 124A of the electron beam optical system 12-2. Similarly, the control apparatus 3 controls the driving electrical current supplied to the second shaping lens 124B of each electron beam optical system 12 so that the direction of a driving electrical current 12B-1 flowing in the second shaping lens 124B of the electron beam optical system 12-1 is inverted with respect to the direction of a driving electrical current 12B-2 flowing in the second shaping lens 124B of the electron beam optical system 12-2. Similarly, the control apparatus 3 controls the driving electrical current supplied to the objective lens 126 of each electron beam optical system 12 so that the direction of a driving electrical current 13A-1 flowing in the objective lens 126 of the electron beam optical system 12-1 is inverted with respect to the direction of a driving electrical current 13A-2 flowing in the objective lens 126 of the electron beam optical system 12-2.

Figure 12C:
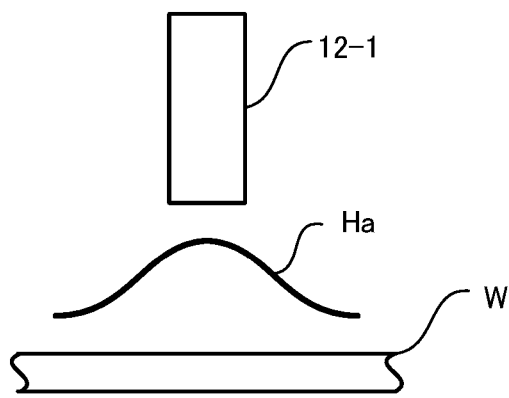
FIG. 12C is a cross-sectional view that illustrate the electron beam optical system in which the static magnetic generator is in the second state and FIG. 12D is a graph that illustrate the leaked magnetic field from the electron beam optical system in which the static magnetic generator is in the second state.
Figure 12D:
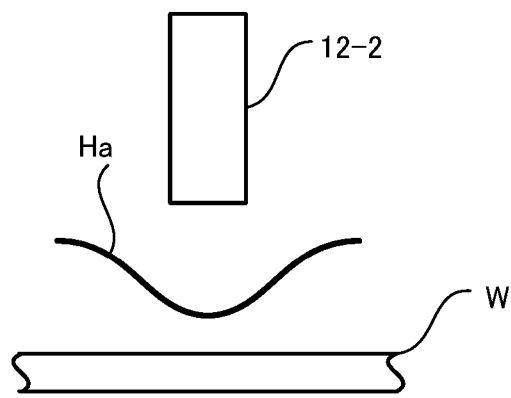

Note that FIG. 12C illustrate the leaked magnetic field Ha from the electron beam optical system 12-1 illustrated in FIG. 12A. FIG. 12D illustrate the leaked magnetic field Ha from the electron beam optical system 12-2 illustrated in FIG. 12B. As illustrated in FIG. 12C and FIG. 12D, when the static magnetic field generator is controlled by the above described controlling method, it turns out that the polarity of the leaked magnetic field Ha from the electron beam optical system 12-1 is inverted with respect to the polarity of the leaked magnetic field Ha from the electron beam optical system 12-2.

Figure 13A:
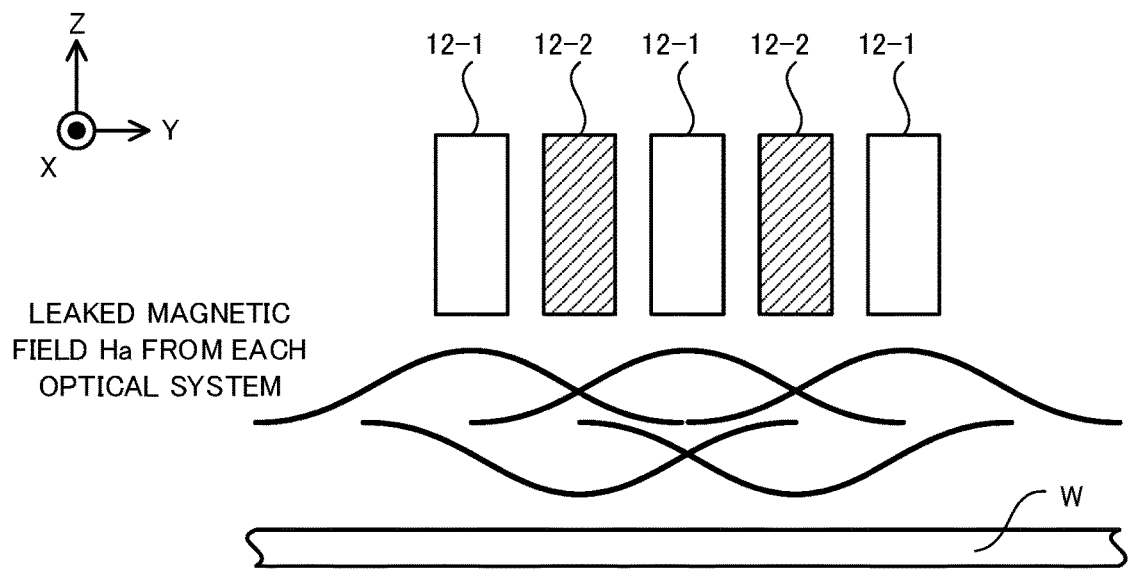
FIG. 13A is a cross-sectional view that conceptually illustrates leaked magnetic fields from the plurality of electron beam optical systems and FIG. 13B is a cross-sectional view that conceptually illustrates a leaked magnetic field that corresponds to a magnetic field in which the leaked magnetic fields from the plurality of electron beam optical systems are combined.
Figure 13B:
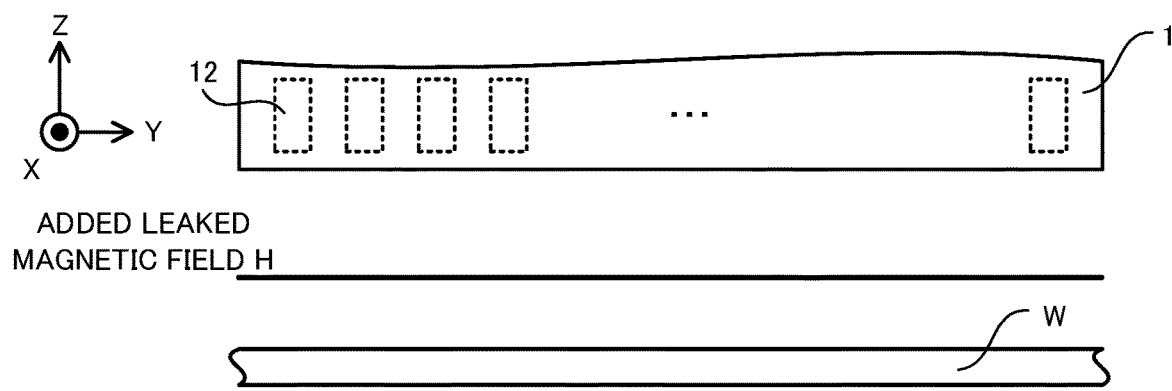

As described above, in the present embodiment, the plurality of electron beam optical systems 12 are controlled so that the leaked magnetic fields Ha having the different polarities are leaked from the adjacent two electron beam optical systems 12. Therefore, as illustrated in FIG. 13A, the leaked magnetic field Ha having a first polarity and the leaked magnetic field Ha having a second polarity are distributed in a matrix in the space above the wafer W. As a result, the leaked magnetic field Ha having the first polarity and the leaked magnetic field Ha having the second polarity that is leaked near the leaked magnetic field Ha having the first polarity are weakened by each other. As a result, the leaked magnetic field H that corresponds to the magnetic field in which the plurality of leaked magnetic field Ha are combined is weakened relatively in the space above the wafer W. For example, the intensity of the leaked magnetic field H becomes so small that the inclined amount of the electron beam EB due to the leaked magnetic field H can be substantially disregarded (namely, so small that the above described displacement of the position of the irradiation area EA can be disregarded). In some cases, as illustrated in FIG. 13B, the leaked magnetic field H becomes zero in the space above the wafer W. Namely, as illustrated in FIG. 13B, the leaked magnetic field H having the sloped intensity does not remain in the space above the wafer W. Alternatively, even when the leaked magnetic field H remains in the space above the wafer W, the slope of the intensity of the leaked magnetic field H becomes so small that the electron beam EB is inclined only slightly and thus the inclined amount can be disregarded. Namely, the influence of the leaked magnetic field H is reduced (ideally, eliminated) appropriately.

Therefore, the exposure apparatus EX is allowed to irradiate the electron beam EB to the desired position on the wafer W without being affected by the leaked magnetic field H or regardless of the influence of the leaked magnetic field H. As a result, the deterioration of the exposure accuracy of the electron beam EB is reduced appropriately.

(4) Modified Example

Next, a modified example of the exposure system SYS will be described.

(4-1) First Modified Example

In the above described description, one of the adjacent two electron beam optical systems 12 is set to be the electron beam optical system 12-1 in the first state and another one of the adjacent two electron beam optical systems 12 is set to be the electron beam optical system 12-2 in the second state. Namely, the electron beam optical systems 12-1 and the electron beam optical systems 12-2 are arranged alternately. However, arranging the electron beam optical systems 12-1 and 12-2 regularly and alternately is one method of reducing the influence of the leaked magnetic field H more effectively. Thus, the electron beam optical systems 12-1 and the electron beam optical systems 12-2 may not be necessarily arranged alternately. Both of the adjacent two electron beam optical systems 12 may be set to be the electron beam optical system 12-1 or 12-2. Even in this case, it is possible to reduce the influence of the leaked magnetic field H.

Figure 14:
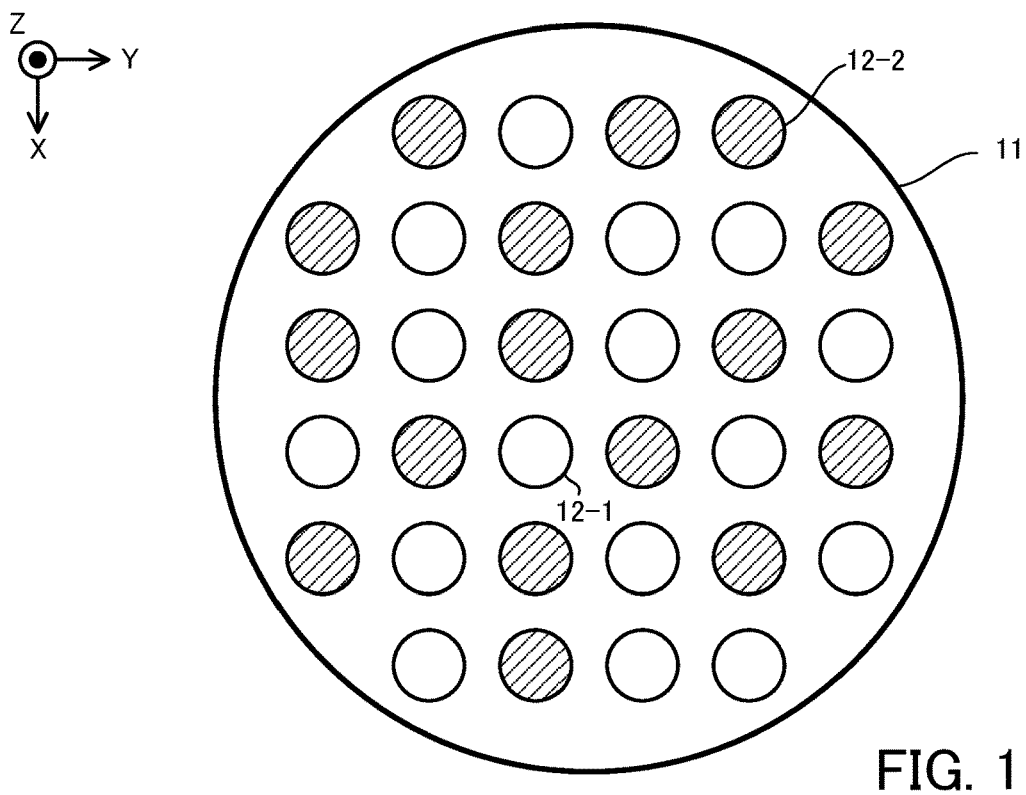
FIG. 14 is a planar view that illustrates one example of an arrangement of the electron beam optical system in which the static magnetic generator is in the first state and the electron beam optical system in which the static magnetic generator is in the second state.

For example, as illustrated in FIG. 14, the electron beam optical systems 12-1 and 12-2 may be arranged randomly (namely, irregularly). Even in this case, it is possible to reduce the influence of the leaked magnetic field H. Note that the number of the electron beam optical system 12-1 may be same as the number of the electron beam optical system 12-2. Alternatively, a difference between the number of the electron beam optical system 12-1 and the number of the electron beam optical system 12-2 may be very small (alternatively, equal to or smaller than a predetermined value). In this case, the influence of the leaked magnetic field H is reduced more effectively. Moreover, even when the electron beam optical systems 12-1 and 12-2 may be arranged randomly, the influence of the leaked magnetic field H is reduced more effectively as an arrangement pattern of the electron beam optical systems 12-1 and 12-2 is closer to an arrangement pattern in which the electron beam optical systems 12-1 and 12-2 are arranged alternately and regularly (see FIG. 11). Therefore, the control apparatus 3 may control the plurality of electron beam optical systems 12 so that the electron beam optical systems 12-1 and 12-2 is arranged randomly on the basis of the arrangement pattern in which the electron beam optical systems 12-1 and 12-2 are arranged alternately and regularly.

Figure 15:
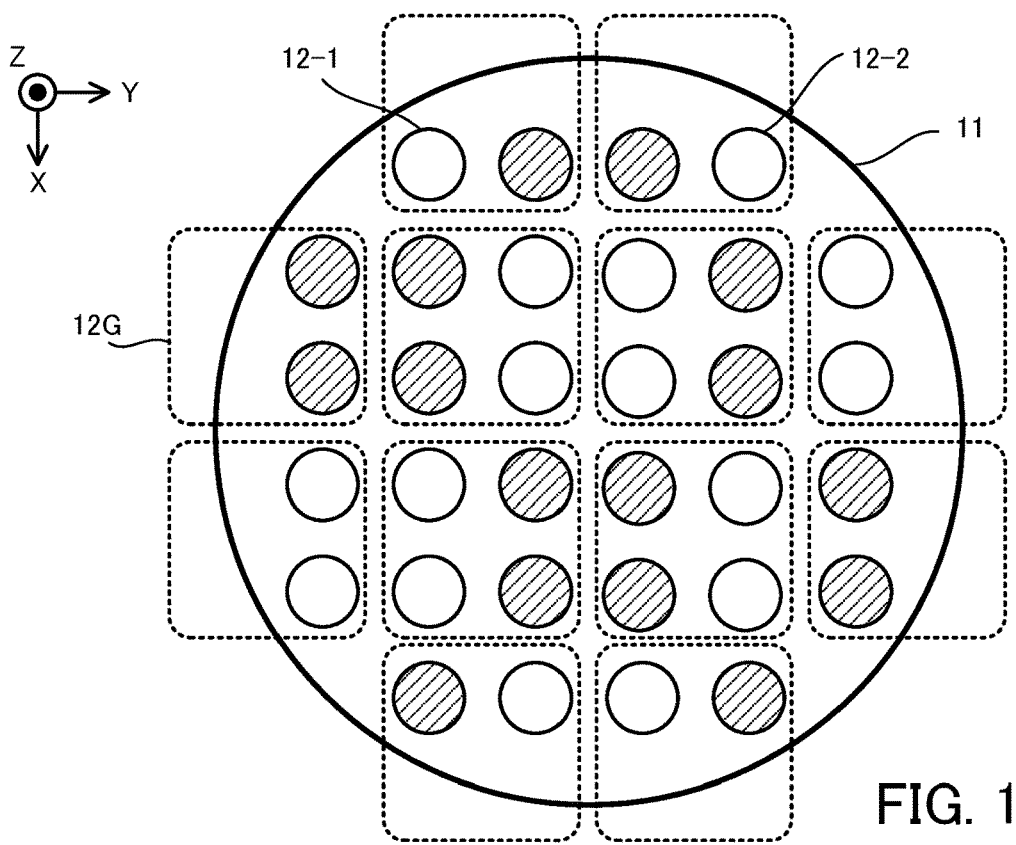
FIG. 15 is a planar view that illustrates one example of an arrangement of the electron beam optical system in which the static magnetic generator is in the first state and the electron beam optical system in which the static magnetic generator is in the second state.

Alternatively, as illustrated in FIG. 15, the control apparatus 3 may control the plurality of electron beam optical systems 12 so that each of the plurality of electron beam optical systems 12 is categorized into a plurality of optical groups 12G each of which includes a plurality of optical systems 12 and the arrangement pattern in which the electron beam optical systems 12-1 and 12-2 is inverted between adjacent two optical groups 12G. Even in this case, at least one electron beam optical system 12-1 and at least one electron beam optical system 12-2 are arranged regularly, and thus, the influence of the leaked magnetic field H is reduced more effectively. Note that the influence of the leaked magnetic field H is reduced more effectively when the number of the electron beam optical system 12-1 and the number of the electron beam optical system 12-2 included in each optical group 12G is same as each other (alternatively, the difference therebetween is very small or equal to or smaller than the predetermined value). Moreover, the influence of the leaked magnetic field H is reduced more effectively as the arrangement pattern of the electron beam optical systems 12-1 and 12-2 included in each optical group 12G is closer to the arrangement pattern in which the electron beam optical systems 12-1 and 12-2 are arranged alternately and regularly. Moreover, as illustrated in FIG. 15, the number of the electron beam optical system 12 included in at least one optical group 12G may be smaller than the number of the electron beam optical system 12 included in another optical group 12G. There is a high possibility that the optical group 12G that includes the small number of electron beam optical system 12 is disposed near an outer circumferential part of the plurality of electron beam optical systems 12.

Figure 16:
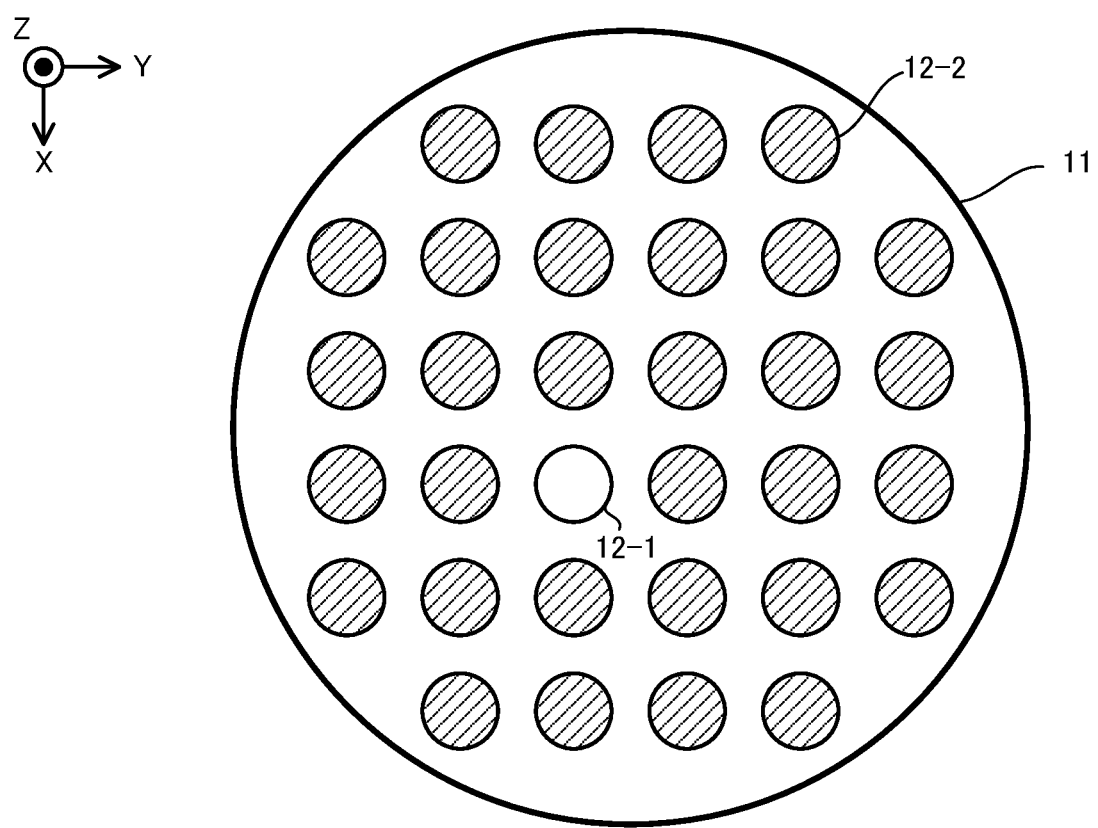
FIG. 16 is a planar view that illustrates one example of an arrangement of the electron beam optical system in which the static magnetic generator is in the first state and the electron beam optical system in which the static magnetic generator is in the second state.

Alternatively, as illustrated in FIG. 16, one of the plurality of electron beam optical systems 12 may be set to be either one of the electron beam optical systems 12-1 and 12-2 and all of the rest of the plurality of electron beam optical systems 12 may be set to be the other one of the electron beam optical systems 12-1 and 12-2. Even in this case, the influence of the leaked magnetic field H is reduced compared to a comparison example in which all of the plurality of electron beam optical systems 12 is set to be either one of the electron beam optical systems 12-1 and 12-2 (namely, the leaked magnetic fields Ha having same polarities are leaked from the plurality of electron beam optical systems 12).

(4-2) Second Modified Example

Figure 17:
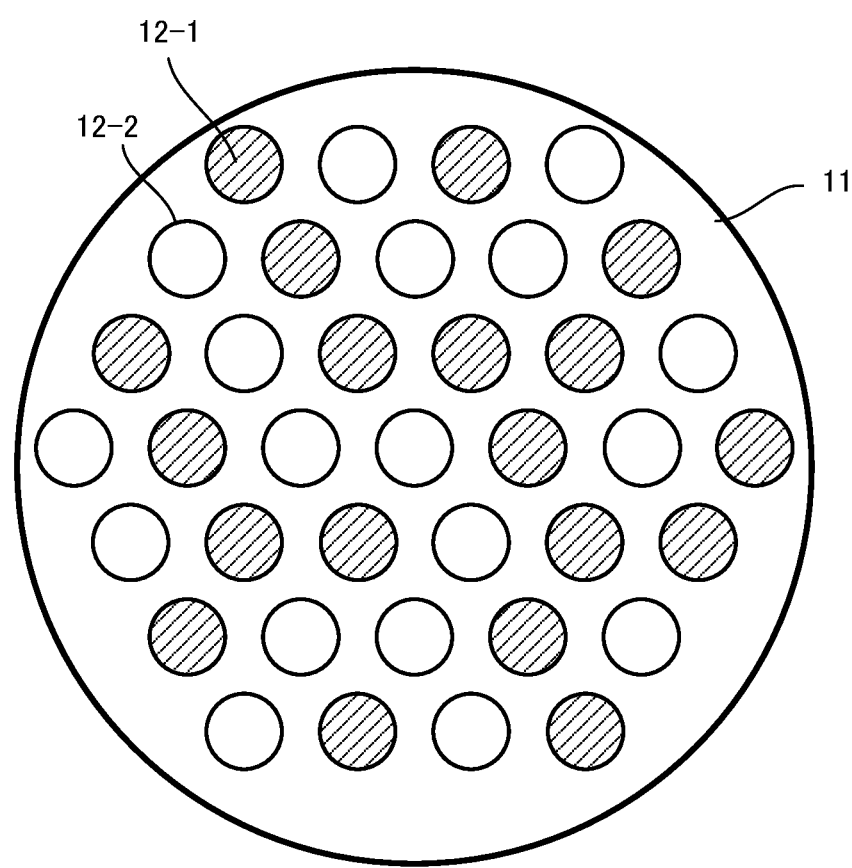
FIG. 17 is a planar view that illustrates one example of an arrangement of the electron beam optical system in which the static magnetic generator is in the first state and the electron beam optical system in which the static magnetic generator is in the second state.

In the above described description, the plurality of electron beam optical systems 12 are arranged in a matrix (namely, in a square-grid arrangement pattern) (see FIG. 5). However, the plurality of electron beam optical systems 12 are arranged in any arrangement pattern on the XY plane. For example, as illustrated in FIG. 17, the plurality of electron beam optical systems 12 may be arranged in a hexagon-grid arrangement pattern. Even when the plurality of electron beam optical systems 12 are arranged in any arrangement pattern, the magnetic field control operation is executable as with the case where the plurality of electron beam optical systems 12 are arranged in the matrix arrangement pattern.

(4-3) Third Modified Example

The above described description describes the magnetic control operation for reducing the influence of the leaked magnetic field due to the magnetic field generated by the static magnetic field generator. However, each electron beam optical system 12 is provided with, as the magnetic field generator, not only the static magnetic field generator but also a dynamic magnetic field generator that need dynamically (namely, sequentially) control the magnetic field or has a high possibility to control the magnetic field during the period when the wafer W is exposed, in many cases. The dynamic magnetic field generator dynamically controls the magnetic field in order to dynamically control the electron beam EB, for example. Namely, the dynamic magnetic field generator dynamically controls the generated magnetic field in order to dynamically control the electron beam EB on the basis of a state of the exposure apparatus EX and a state of the wafer W during the period when the wafer W is exposed, for example. Therefore, there is a possibility that the leaked magnetic field H due to the magnetic field generated by the dynamic magnetic generator also exists above the wafer W. Thus, the third modified example will describe a case where the influence of the leaked magnetic field due to the magnetic field generated by the dynamic magnetic field generator is reduced. Note that the deflector 1271 is one example of the dynamic magnetic field generator in the above described electron beam optical system 12. Therefore, an example in which the dynamic magnetic field generator is the deflector 1271 will be described in the following description.

Here, as described above, the deflector 1271 need dynamically control the magnetic field or has a high possibility to control the magnetic field during the period when the wafer W is exposed. Thus, considering an original function of the deflector 1271 (namely, a function for dynamically controlling the irradiation position of the electron beam EB finely), it is difficult to simply apply the magnetic field control operation for reducing the influence of the leaked magnetic field H of the static magnetic field generator to the deflector 1271. Specifically, if the above described magnetic field control operation is simply applied to the deflector 1271, the polarities of the magnetic fields generated by two deflectors 1271 of the adjacent two electron beam optical system 12 are inverted to each other. However, the original purpose of the deflector 1271 is to generate the magnetic field necessary to finely control the irradiation position to be a desired position (namely, to deflect the electron beam EB toward a desired direction). Thus, if the polarities of the magnetic fields generated by the deflectors 1271 are inverted to each other for the purpose of reducing the influence of the leaked magnetic field H, there is a possibility that the deflectors 1271 is not allowed to generate the magnetic field necessary to finely control the irradiation position to be the desired position. Therefore, there is a possibility that it is difficult to dynamically and finely control the irradiation position of the electron beam EB that is the original purpose of the deflector 1271 when the magnetic field control operation is simply applied to the deflector 1271.

Thus, the third modified example reduces the influence of the leaked magnetic field H (alternatively, the leaked magnetic field Ha, same applies to the following description) generated by the deflector 1271 by setting a disposed position of the deflector 1271 properly in the electron beam optical system 12.

Specifically, the intensity of the magnetic field generated by the deflector 1271 is proportional to a square of a distance from the deflector 1271 that is a generation source of the magnetic field. Thus, the influence (especially, the influence in the space above the wafer W) of the leaked magnetic field H due to the magnetic field generated by the deflector 1271 becomes smaller as the distance between the deflector 1271 and the wafer W becomes larger. Therefore, it is better to dispose the deflector 1271 at a disposing position that is far from the wafer W as much as possible. For example, the deflector 1271 may be disposed so that the distance from the wafer W along the optical axis AX is a distance (for example, a first predetermined distance) that realizes a state where the influence of the leaked magnetic field H due to the magnetic field generated by the deflector 1271 is so small and thus is disregarded.

The lower end part (namely, the open end) of the housing 121 of each electron beam optical system 12 is the closest to the wafer W. Thus, the deflector 1271 may be disposed at a disposing position that is far from the lower end part of the housing 121 as much as possible. For example, the deflector 1271 may be disposed so that the distance from the lower end part of the housing 121 along the optical axis AX is a distance (for example, a second predetermined distance) that realizes the state where the influence of the leaked magnetic field H due to the magnetic field generated by the deflector 1271 is so small and thus is disregarded.

Figure 18:
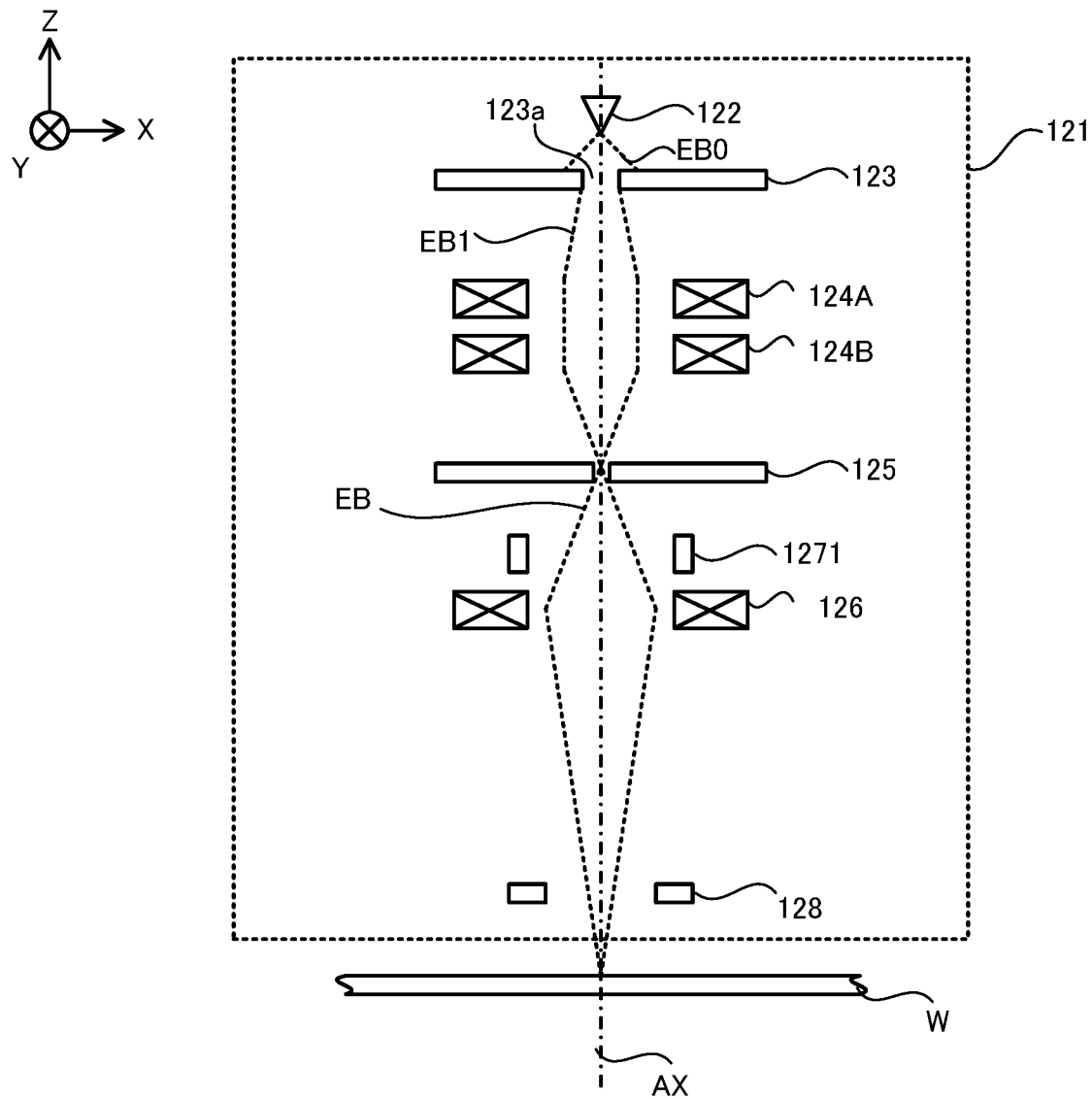
FIG. 18 is a cross-sectional view that illustrates a cross-sectional surface (a cross-sectional surface including an optical axis of the electron beam optical system) of the electron beam optical system in a third modified example.

As one example, as illustrated in FIG. 18, the deflector 1271 may be disposed above (namely, at a +Z side from) the objective lens 126. Namely, the deflector 1271 may be disposed at a position that is farther from the wafer W or the lower end part of the housing 121 than the objective lens 126 is. However, even when the deflector 1271 is disposed above the objective lens 126, the deflector 1271 is disposed below the second shaping diaphragm 125. Alternatively, the deflector 1271 may be disposed so that a distance between the deflector 1271 and the second shaping diaphragm 125 along the Z axis direction is longer than a distance between the deflector 1271 and the lower end part of the housing 121 along the Z axis direction. Alternatively, the deflector 1271 may be disposed so that the distance between the deflector 1271 and the second shaping diaphragm 125 along the Z axis direction is longer by a third predetermined distance than the distance between the deflector 1271 and the lower end part of the housing 121 along the Z axis direction.

The above described third modified example allows not only the influence of the leaked magnetic field H generated by the static magnetic field generator but also the influence of the leaked magnetic field H generated by the dynamic magnetic field generator to be reduced appropriately. Note that the above described static magnetic field control operation may not be executed. Even in this case, the fact remains that the influence of the leaked magnetic field H generated by the dynamic magnetic field generator is reduced appropriately as long as the dynamic magnetic field generator is disposed at the above described position.

Note that the above described description illustrates that the deflector 1271 is one example of the dynamic magnetic field generator. However, the electron beam optical system 12 may be provided with the dynamic magnetic field generator that is different from the deflector 1271. Even in this case, the fact remains that the influence of the leaked magnetic field H generated by the dynamic magnetic field generator is reduced appropriately as long as the dynamic magnetic field generator that is different from the deflector 1271 is disposed at the above described position.

For example, the electron beam optical system 12 may be provided with a dynamic correction lens (Dynamic Focus Lens) as the dynamic magnetic field generator. The dynamic correction lens is provided with a coil that is configured to generate a magnetic field that is symmetric with respect to the optical axis AX. The dynamic correction lens is configured to control at least one of a rotation (namely, a position in the θZ direction) of an image that is formed by the electron beam EB on a predetermined optical plane (for example, an optical plane that intersects with an optical path of the electron beam EB), a magnification of the image and a focal position that corresponds to an image-formed position by a control of a driving electrical current supplied to the coil. Therefore, the electron beam optical system 12 may be provided with, as the dynamic magnetic field generator, at least one of a first dynamic correction lens that is configured to control the rotation of the image, a second dynamic correction lens that is configured to control the magnification of the image and a third dynamic correction lens that is configured to control the focal position. In this case, at least one of the first to third dynamic correction lenses may be disposed at the above described position (namely, a position that is same as the position at which the deflector 1271 is disposed).

For example, the electron beam optical system 12 may be provided with a stigmator as the dynamic magnetic field generator. The stigmator is provided with a coil that is configured to generate a distributed magnetic field in a 2θ direction (namely, a diffraction angle of the electron beam EB) along a direction that is perpendicular to a lens field virtually generated by the stigmator. The stigmator is configured to control either of an orthogonality of the image that is formed by the electron beam EB on the predetermined optical plane and an anisotropic magnification (namely, an astigmatism) of the image by a control of a driving electrical current supplied to the coil. Therefore, the electron beam optical system 12 may be provided with, as the dynamic magnetic field generator, at least one of a first stigmator that is configured to control the orthogonality of the image and a second stigmator that is configured to control the anisotropic magnification of the image. In this case, at least one of the first to second stigmators may be disposed at the above described position (namely, a position that is same as the position at which the deflector 1271 is disposed).

(4-4) Fourth Modified Example

An exposure apparatus EX4 in the fourth modified example is provided with a plurality of electron beam optical systems 22 instead of the above described plurality of electron beam systems 12. Next, a structure of the electron beam optical system 22 will be described with reference to FIG. 19.

Figure 19:
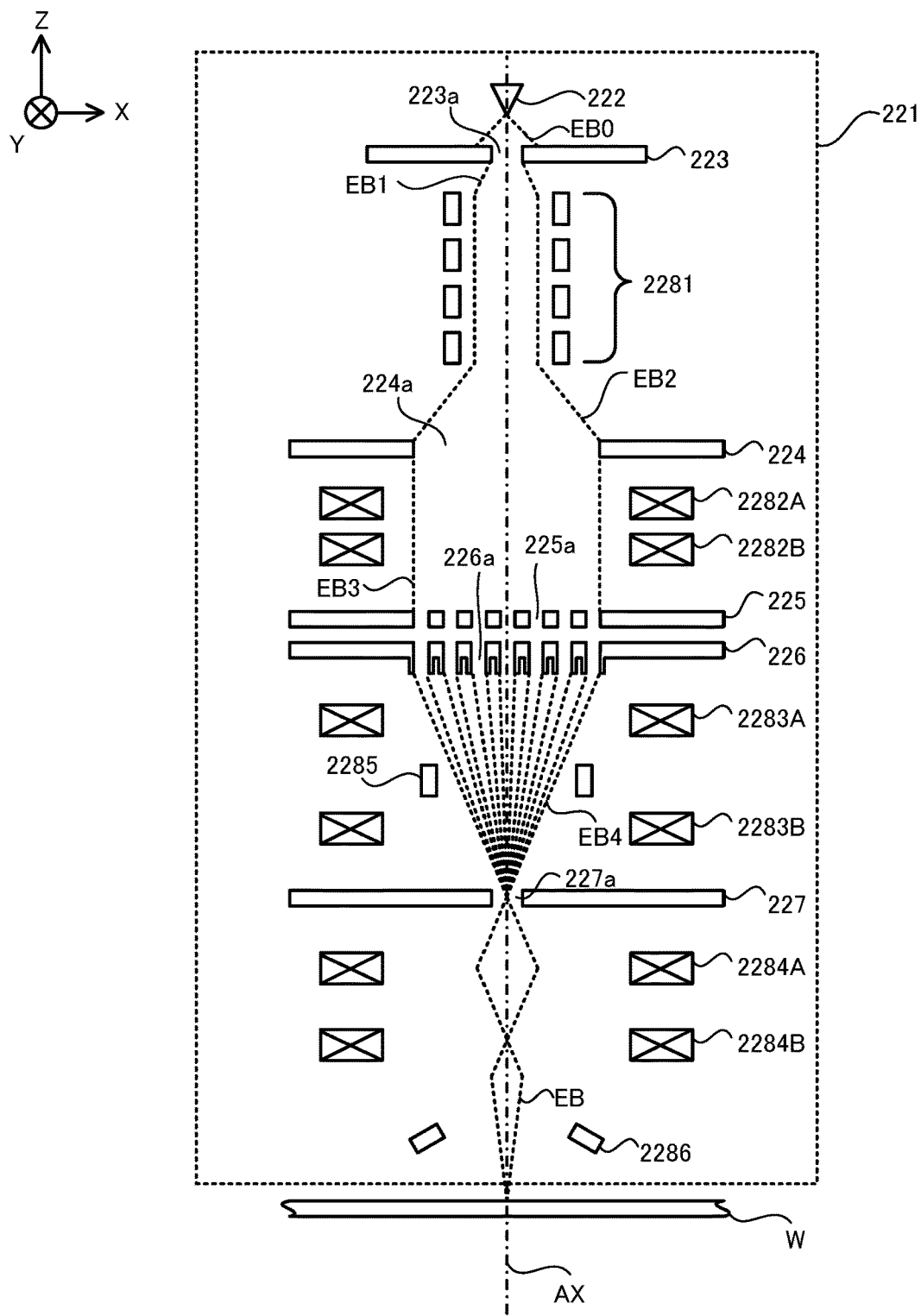
FIG. 19 is a cross-sectional view that illustrates a cross-sectional surface (a cross-sectional surface including an optical axis of the electron beam optical system) of the electron beam optical system in a fourth modified example.

As illustrated in FIG. 19, the electron beam optical system 22 is provided with a cylindrical housing (in other words, a column cell) 221. Moreover, the electron beam optical system 22 is provided with an electron gun 222, a first aperture plate 223, a primary beam shaping plate 224, a beam shaping aperture plate 225, a blanker plate 226 and a final aperture plate 227 in the housing 221. The first aperture plate 223, the primary beam shaping plate 224, the beam shaping aperture plate 225, the blanker plate 226 and the final aperture plate 227 are arranged in this order below (namely, at the −Z side from) the electron gun 222 to have a predetermined positional relationship. A unit including the beam shaping aperture plate 125 and the blanker plate 126 is referred to as a "blanking aperture array unit".

Moreover, the electron beam optical system 22 is provided with an asymmetric illumination optical system 2281, an electromagnetic lens (namely, an electron lens, same applies to the following description) 2282A, an electromagnetic lens 2282B, an electromagnetic lens 2283A, an electromagnetic lens 2283B, an electromagnetic lens 2284A and an electromagnetic lens 2284B. The asymmetric illumination optical system 2281 is arranged between the first aperture plate 223 and a primary beam shaping plate 224. The electromagnetic lenses 2282A and 2282B are arranged between the primary beam shaping plate 224 and the beam shaping aperture plate 225. The electromagnetic lenses 2282A and 2282B are arranged to have a predetermined first gap along a vertical direction (namely, the Z axis direction). The electromagnetic lenses 2283A and 2283B are arranged between blanker plate 226 and the final aperture plate 227. The electromagnetic lenses 2283A and 2283B are arranged to have a predetermined second gap along the vertical direction. The electromagnetic lenses 2284A and 2284B are arranged below the final aperture plate 227. The electromagnetic lenses 2284A and 2284B are arranged to have a predetermined third gap along the vertical direction. Each of the electromagnetic lenses 2282A and 2284B is provided with a col to which a driving electrical current is supplied under the control of the control apparatus 3 and through an inner space of a winding of which the optical axis AX passes. As a result, each of the electromagnetic lenses 2282A and 2284B generates the magnetic field for controlling (for example, converging) the electron beam. A deflector 2285 is disposed at a position that is inside of the electromagnetic lens 2284B and slightly above the electromagnetic lens 2284B.

The electron gun 222 emits an electron beam EB0 having a predetermined acceleration voltage (for example, 50 keV). The electron beam EB0 passes through an aperture 223a of the first aperture plate 223. As a result, the electron beam EB0 is shaped into an electron beam EB1 having a circular cross-sectional surface that is symmetric around the optical axis AX.

The asymmetric illumination optical system 2281 shapes the electron beam EB1 that is shaped to have the circular cross-sectional surface into an electron beam EB2 having a cross-sectional surface that is long along one direction (for example, the X axis direction) and that is short along another direction (for example, the Y axis direction). The asymmetric illumination optical system 2281 includes an electrostatic quadrupole lens group that generates an electrostatic quadrupole field on or near the optical axis AX, for example. The electron beam EB1 having the circular cross-sectional surface is shaped into the electron beam EB2 having a longitudinal surface by controlling the electrostatic quadrupole field generated by the electrostatic quadrupole field under the control of the control apparatus 3.

The electron beam EB2 is irradiated on an area including an aperture 224a on the circular primary beam shaping plate 224. The aperture 224a is formed at a center part of the primary beam shaping plate 224 in the Y axis direction. The aperture 224a is a slit aperture elongated in the X axis direction. The electron beam EB2 passes through the aperture 224a of the primary beam shaping plate 224. As a result, the electron beam EB2 is shaped into an elongated electron beam EB3. Then, the electron beam EB3 forms an image on the beam shaping aperture plate 225 by the electromagnetic lenses 2282A and 2282B.

Figure 20:
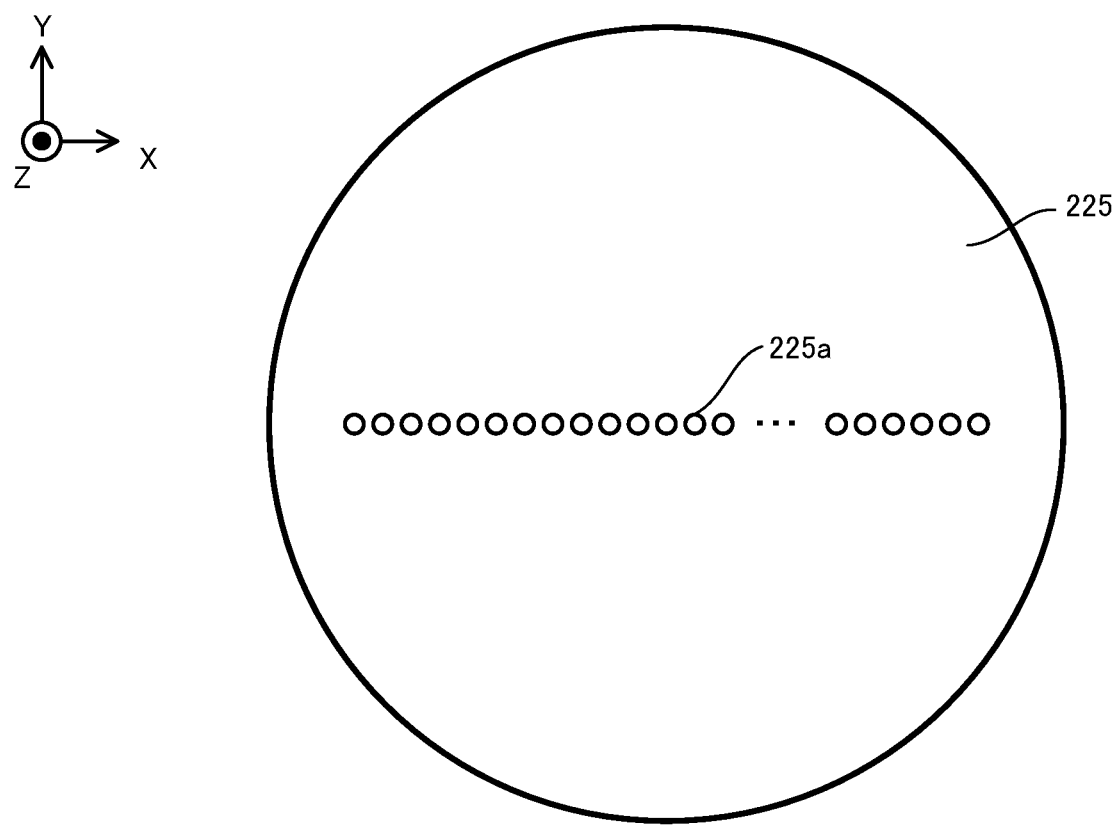
FIG. 20 is a planar view that illustrates a beam shaping aperture plate of the electron beam optical system.

A plurality of apertures 225a are formed at a position corresponding to the aperture 224a of the primary beam shaping plate 224 on the beam shaping aperture plate 225. Specifically, as illustrated in FIG. 20 that is a planar view illustrating the beam shaping aperture plate 225, a plurality of apertures 225a in a row lined in the X axis direction are formed on the beam shaping aperture plate 225. A predetermined number (for example, 4000 to 5000) of apertures 225a are formed on the beam shaping aperture plate 225. The plurality of apertures 225a are arranged to line in a predetermined pitch (for example, several micrometer, and 1 micrometer to 4 micrometer as one example). Each aperture 225a is a circular aperture.

Again in FIG. 19, the electron beam EB3 from the primary beam shaping plate 224 is irradiated to an irradiation area on the beam shaping aperture plate 225. The irradiation area is an area that extends in the X axis direction and that corresponds to an area at which the plurality of apertures 225a area formed. As a result, a plurality of electron beam EB4 are emitted from the beam shaping aperture plate 225 via the plurality of apertures 225a.

The blanker plate 226 is disposed below the beam shaping aperture plate 225 so as to close to the beam shaping aperture plate 225. A plurality of apertures 226a are formed in the blanker plate 226. The plurality of apertures 226a are formed at an areas corresponding to the plurality of apertures 225a of the beam shaping aperture plate 225, respectively. Each aperture 226a is larger than the aperture 225a. Therefore, the electron beam EB4 passing through a certain aperture 225a is allowed to pass through the aperture 226a corresponding to the certain aperture 225a.

A pair of blanking electrodes for deflecting the electron beam EB4 emitted from each aperture 226a are disposed at each aperture 226a to sandwich each aperture 226a in the Y axis direction. Each of the pair of blanking electrodes is connected to a driving circuit via a wiring and terminal. Note that the blanking electrodes and the wiring are formed integrally with the blanker plate 226 by patterning a conductor film having a thickness of a several micrometer to several tens of micrometer on a main body of the blanker plate 226. The blanking electrodes are formed at a lower surface (namely, a surface on a downstream side along a propagation direction of the electron beam EB4) of the blanker plate 226 in order to prevent a damage due to the irradiation of the electron beam EB4.

When an electrical voltage is applied to the pair of the blanking electrodes, the electron beam EB4 passing through the aperture 226a is greatly deflected by an electric field generated between the pair of the blanking electrodes. As a result, the electron beam EB4 deflected by the electric field generated between the pair of the blanking electrodes is guided to an outside of an circular aperture 227a of the final aperture plate 227 that is disposed below the blanker plate 226. Therefore, the electron beam EB4 is blocked by the final aperture plate 227. Note that the aperture 227a is formed near the optical axis AX of the electron beam optical system 22. On the other hand, when an electrical voltage is not applied to the pair of the blanking electrodes, the electron beam EB4 passing through the aperture 226a is not greatly deflected. As a result, the electron beam EB4 passing through the aperture 226a passes through the aperture 227a of the final aperture plate 227. Namely, an ON/OFF of the plurality of electron beams EB4 passing through the plurality of apertures 226a, respectively, are controlled independently by independently controlling the applications of the electrical voltages to the plurality pairs of blanking electrodes disposed at the plurality of apertures 226, respectively.

The electron beam EB4 passing through the final aperture plate 227 is irradiated to the wafer W as the electron beam EB for exposing the wafer W. In this process, the electron beam EB including the plurality of electron beams EB4 passing through the plurality of apertures 225a of the beam shaping aperture plate 225, respectively, form an image on the surface of the wafer W by a predetermined reduction magnification $\lambda$ by the electromagnetic lenses 2283A, 2283A, 2284A and 2284B.

Moreover, the electron beam optical system 22 is provided with a deflector 2285. The deflector 2285 is same as the above described deflector 1271. Therefore, a detailed description of the deflector 2285 is omitted.

As described above, in the fourth modified example, the electron beam EB irradiated by each electron beam optical system 22 is an aggregate of the plurality (for example, 4000 to 5000) of electron beams EB4. Each electron beam optical system 22 is allowed to control the ON/OFF of the plurality of electron beams EB4 independently and deflect them independently. Therefore, the each electron beam optical system 22 is what we call a multi-beam optical system (the exposure apparatus Ex is a multi-beam type of exposure apparatus) that is configured to irradiate the plurality of electron beams EB4 as the electron beam EB.

The above described magnetic field control operation may be executed by the exposure apparatus EX4 in the fourth modified example. Specifically, in the fourth modified example, the electron beam optical system 22 is provided with the asymmetric illumination optical system 2281, the electromagnetic lens 2282A, the electromagnetic lens 2282B, the electromagnetic lens 2283A, the electromagnetic lens 2283B, the electromagnetic lens 2284A and the electromagnetic lens 2284B as the static magnetic field generator. Therefore, the control apparatus 3 controls the asymmetric illumination optical system 2281 of each electron beam optical system 22 so that the polarity of the magnetic field generated by the asymmetric illumination optical system 2281 of an electron beam optical system 22-1 is inverted with respect to the polarity of the magnetic field generated by the asymmetric illumination optical system 2281 of an electron beam optical system 22-2. Same applies to the electromagnetic lens 2282A, the electromagnetic lens 2282B, the electromagnetic lens 2283A, the electromagnetic lens 2283B, the electromagnetic lens 2284A and the electromagnetic lens 2284B. Moreover, the electron beam optical systems 22-1 and 22-2 are arranged in an arrangement manner that is same as an arrangement manner in which the above described electron beam optical systems 12-1 and 12-2 are arranged. As a result, the exposure apparatus EX4 in the fourth modified example is allowed to irradiate the electron beam EB on the desired position on the wafer W without being affected by the leaked magnetic field H or regardless of the influence of the leaked magnetic field H, as with the above described exposure apparatus EX. As a result, the deterioration of the exposure accuracy of the electron beam EB is reduced appropriately.

Moreover, in the fourth modified example, the influence of the leaked magnetic field H (alternatively, the leaked magnetic field Ha, same applies to the following description) generated by the deflector 2285 may be reduced by setting a disposed position of the deflector 2285 (alternatively, another dynamic magnetic field generator) properly in the electron beam optical system 12, as with the above described third modified example, in addition to or instead of the above described magnetic field control operation being executed.

As one example, as illustrated in FIG. 19, the deflector 2285 may be disposed above (namely, +Z side from) the final aperture plate 227. Namely, the deflector 2285 may be disposed at a position that is farther from the wafer W or the lower end part of the housing 221 than the final aperture plate 227 is. However, a space above the final aperture plate 227 is used as a space in which the electromagnetic lenses 2283A and 2283B converges the plurality of electron beams EB4. Therefore, the plurality of electron beams EB4 distributes more widely in the X axis direction above the final aperture plate 227, compared to a space below the final aperture plate 227. Especially, a distribution range of the plurality of electron beams EB4 in the X axis direction becomes wider as it is farther from the final aperture plate 227 upward. Thus, it is more difficult for the deflector 2285 to finely control the irradiation position of the electron beam EB that is the aggregate of the plurality of electron beams EB4 although the influence of the leaked magnetic field H due to the deflector 2285 is reduced more effectively as it is farther from the final aperture plate 227 upward. Thus, the disposing position of the deflector 2285 may be set by considering a trade-off between an easiness of finely controlling the irradiation position of the electron beam EB by the deflector 2285 and a degree of reduction of the influence of the leaked magnetic field H.

However, even when the deflector 2285 is disposed above the final aperture plate 227, the deflector 2285 is disposed below the blanker plate 226. This is because the electron beam EB4 passing through the aperture 226a of the blanker plate 226 does not exists above the blanker plate 226 and thus it is impossible for the deflector 2285 to finely control the irradiation position of the electron beam EB that is the aggregate of the plurality of electron beams EB4.

Therefore, the deflector 2285 is disposed at any position between the final aperture plate 227 and the blanker plate 226, for example. For example, the deflector 2285 may be disposed to be adjacent to the final aperture plate 227. For example, the deflector 2285 may be disposed near the aperture 227a of the final aperture plate 227. For example, the deflector 2285 may be disposed below the electromagnetic lens 2283B. For example, the deflector 2285 may be disposed at the same height (namely, a position at which a position in the Z axis direction is same) as the electromagnetic lens 2283B. For example, the deflector 2285 may be disposed between the electromagnetic lens 2283B and the electromagnetic lens 2283A. For example, the deflector 2285 may be disposed at the same height as the electromagnetic lens 2283A. For example, the deflector 2285 may be disposed above the electromagnetic lens 2283A. For example, the deflector 2285 may be disposed to be adjacent to the blanker plate 226. Note that FIG. 19 illustrates an example in which the deflector 2285 is disposed between the electromagnetic lens 2283B and the electromagnetic lens 2283A.

(4-4) Additional Modified Example

The exposure system SYS described with reference to FIG. 1 to FIG. 20 is one example. Therefore, at least one portion of the exposure system SYS may be modified if needed. Next, one example of modification of the exposure system SYS will be described.

In the above described description, the magnetic field control operation allows the polarities of the plurality of magnetic fields generated by the plurality of static magnetic field generators of the electron beam optical system 12-1, respectively, to be inverted with respect to the polarities of the plurality of magnetic fields generated by the plurality of static magnetic field generators of the electron beam optical system 12-2, respectively. However, the polarity of the magnetic field generated by one portion of the plurality of static magnetic field generators of the electron beam optical system 12-1 may not be inverted with respect to the polarity of the magnetic field generated by one portion of the plurality of static magnetic field generators of the electron beam optical system 12-2, as long as the leaked magnetic field Ha from the electron beam optical system 12-1 and the leaked magnetic field Ha from the electron beam optical system 12-2 are weakened by each other. Namely, the polarity of the magnetic field generated by one static magnetic field generator of the plurality of static magnetic field generators of the electron beam optical system 12-1 may be inverted with respect to the polarity of the magnetic field generated by one static magnetic field generator of the plurality of static magnetic field generators of the electron beam optical system 12-2 and the polarity of the magnetic field generated by another static magnetic field generator of the plurality of static magnetic field generators of the electron beam optical system 12-1 may be same as the polarity of the magnetic field generated by another static magnetic field generator of the plurality of static magnetic field generators of the electron beam optical system 12-2.

In the above described description, the magnetic field control operation controls the polarities of the leaked magnetic fields Ha from the plurality of electron beam optical systems 12. However, the magnetic field control operation may control another characteristic of the leaked magnetic fields Ha from the plurality of electron beam optical systems 12, as long as the influence of the leaked magnetic field H is reduced (for example, the intensity of the leaked magnetic field H is so small and thus is disregarded in the space above the wafer W).

In the above described description, the exposure system SYS is provided with the exposure apparatus EX that is configured to irradiate the wafer W with the electron beam EB to expose the wafer. W. However, the exposure system SYS may be provided with an exposure apparatus EX that is configured to irradiate the wafer W with any charged particle beam (for example, an ion beam) different from the electron beam EB to expose the wafer. W.

In the above described description, the exposure apparatus EX is a single-beam-type of exposure apparatus in which each electron beam optical system 12 uses the single electron beam EB to draw or transfer the pattern on the wafer W. Especially, the exposure apparatus EX is a variable-shape-type of exposure apparatus in which each electron beam optical system 12 shapes the cross-sectional plane of the electron beam EB irradiated to the wafer W into the quadrangular shape having a variable size. However, the exposure apparatus EX may be a point-beam-type of exposure apparatus in which each electron beam optical system 12 irradiates the wafer W with the electron beam EB having a spot shape. The exposure apparatus EX may be a stencil-mask-type of exposure apparatus in which each electron beam optical system 12 shapes the electron beam EB into a desired shape by using a stencil mask at which a beam passing hole having a desired shape is formed. Alternatively, the exposure apparatus EX may be a multi-beam-type of exposure apparatus in which each electron beam optical system 12 uses a plurality of electron beams to draw or transfer the pattern on the wafer W. For example, the exposure apparatus EX may be an exposure apparatus in which each electron beam optical system 12 draws the pattern on the wafer W by generating the plurality of electron beams through a blanking aperture array having a plurality of apertures and turning on/off the plurality of electron beams independently on the basis of drawn pattern (see the fourth modified example). For example, the exposure apparatus EX may be an exposure apparatus in which each electron beam optical system 12 is provided with a surface-emission-type of electron beam source having a plurality of electron emission parts that emit the plurality of electron beams, respectively.

The exposure apparatus EX may be a collective-transfer-type of exposure apparatus that is configured to collectively transfer the pattern of one semiconductor chip or the pattern of a plurality of semiconductor chips from a mask to the wafer W. The exposure apparatus EX may be a divided-transfer-type of exposure apparatus that is configured to perform the exposure with a through-put higher than the collective-transfer-type. The divided-transfer-type of exposure apparatus is configured to divide the pattern that is transferred to the wafer W into a plurality of small areas smaller than a size corresponding to one shot area S on a mask and transfer the patterns of the plurality of small areas to the wafer W. Note that there is a reduction-transfer-type of exposure apparatus that is configured to irradiate the electron beam EB to a certain area of a mask having the pattern of one semiconductor chip and reduction-transfer an image of the pattern of the area to which the electron beam EB is irradiated by a projection lens, as the divided-transfer-type of exposure apparatus.

The exposure apparatus EX may be a scanning stepper. The exposure apparatus EX may be a static exposure apparatus such as a stepper. The exposure apparatus EX may be a reduction projection exposure apparatus of a step-and-stitch method that is configured to synthesize at least one portion of one shot area S and at least one portion of another shot area S.

In the above described description, the wafer W is transported in the exposure system SYS in a state where the wafer W is held by the shuttle SHL. However, the wafer W may be transported in the exposure system SYS alone (namely, in a state where the wafer W is not held by the shuttle SHL).

In the above described description, the barrel 11 is suspended and supported by the metrology frame 13 in the electron beam irradiation apparatus 1. However, the barrel 11 may be disposed on a floor in the electron beam irradiation apparatus 1. For example, the barrel 11 may be supported by a bottom surface of the outer frame F (alternatively, a body disposed on the floor) from below. In this case, the electron beam irradiation apparatus 1 may not be provided with the metrology frame 13.

In the above described description, the beam shaping aperture plate 125 in which the plurality of apertures 125*a* arranged in line in a strip-shaped area having a predetermined width in the X axis direction are formed. However, a beam shaping aperture plate in which two aperture arrays each of which includes predetermined number of apertures arranged in the X axis direction are arranged to be displaced with respect to each other in the X axis direction so that the apertures included in the two apertures arrays do not overlap with each other in the Y axis direction may be used instead of the beam shaping aperture plate 125. In this case, the plurality of apertures on the beam shaping aperture plate may not be necessarily arranged in the strip-shaped area. However, it is preferable that the positions of the apertures are different from each other in the X axis direction so that the apertures do not overlap with each other in the Y axis direction.

In the above described description, an exposed target for the exposure system SYS is the semiconductor substrate (namely, the wafer W) for manufacturing the semiconductor device. However, the exposed target for the exposure system SYS may be any substrate. For example, the exposure system SYS may be an exposure system for manufacturing an organic electro-luminescence, a thin film magnetic head, an imaging element (CCD and the like), a micro machine or a DNA chip. For example, the exposure system SYS may be an exposure system for drawing a mask pattern on a squared-shaped glass plate or a silicon wafer.

In the above described description, the exposure system SYS is provided with the plurality of exposure apparatuses EX. However, the exposure system SYS may be provided with single exposure apparatus EX instead of the plurality of exposure apparatuses EX. In the above described description, the exposure apparatuses EX1 to EX10 are arranged in two rows in the exposure system SYS. However, the plurality of exposure apparatuses EX may be arranged in a row in the exposure system SYS. Alternatively, the plurality of exposure apparatuses EX may be arranged in three or more rows in the exposure system SYS.

Figure 21:
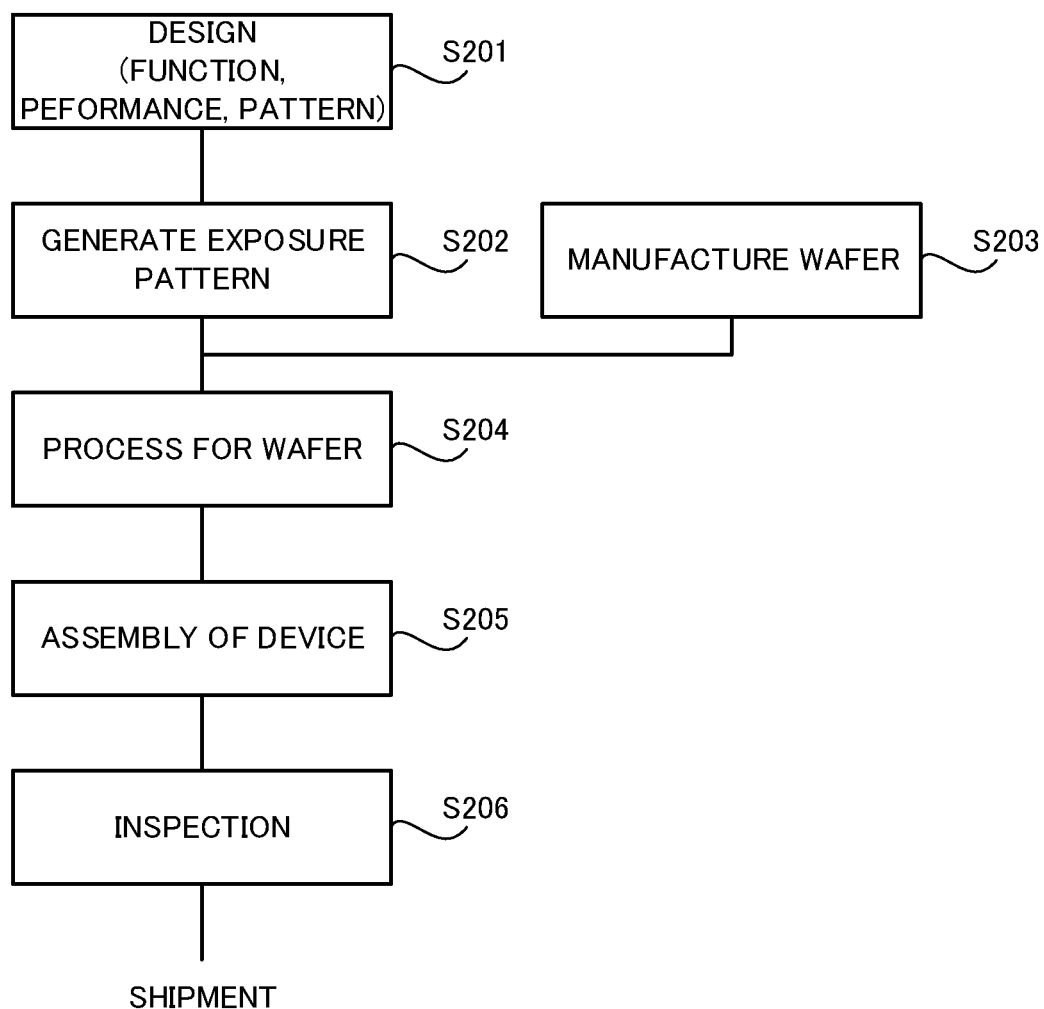
FIG. 21 is a flowchart that illustrates a flow of a device manufacturing method.

A device such as the semiconductor device may be manufactured through each step illustrated in FIG. 21. Steps for manufacturing the device may include a step S201 at which function and performance of the device is designed, a step S202 at which an exposure pattern based on the designed function and performance (namely, an exposure pattern by the electron beam EB) is generated, a step S203 at which the wafer W which is the base material of the device is manufactured, a step S204 at which the wafer W is exposed by the electron beam EB based on the generated exposure pattern and the exposed wafer W is developed, a step S205 including a device assembling process (a processing process such as a dicing process, a bonding process, a packaging process and the like) and an inspection step S206 at which the device is inspected.

At least one portion of the aspect of each embodiment (including each modified example, same applies to this paragraph) described above may be appropriately combined with at least another one portion of the aspect of each embodiment described above. One portion of the aspect of each embodiment described above may not be used. Moreover, the disclosures of all publications and United States patents that are cited in each embodiment described above are incorporated in the disclosures of the present application by reference, if it is legally permitted.

The present invention is not limited to the above described embodiment. The present invention can be changed, if desired, without departing from the essence or spirit of the invention that can be read from the claims and the entire specification. A charged particle beam optical system, an exposure apparatus, an exposure method and a device manufacturing method, which involve such changes, are also intended to be within the technical scope of the present invention.

DESCRIPTION OF REFERENCE CODES

SYS exposure system
EX exposure apparatus
ALG alignment apparatus
W wafer
SHL shuttle
EB electron beam
EA irradiation area
S shot area
1 electron beam irradiation apparatus
11 barrel
12 electron beam optical system
122 electron gun
125 beam shaping aperture plate
126 blanker plate
127 final aperture plate
1281 asymmetric illumination optical system
1282A, 1282B, 1283A, 1283B, 1284A, 1284B electromagnetic lens
1285 deflector
1286 reflected electron detect apparatus
13 metrology frame
2 stage apparatus
22 stage
23 stage driving system
24 position measuring equipment
3 control apparatus

The invention claimed is:

1. A charged particle beam optical system comprising:
a first irradiation optical system configured to irradiate a first charged particle beam and having (i) a first electromagnetic lens that is controlled to generate a first static magnetic field and (ii) a first deflector configured to control an irradiation position of the first charged particle beam;
a second irradiation optical system configured to irradiate a second charged particle beam and having (i) a second electromagnetic lens that is controlled to generate a second static magnetic field and (ii) a second deflector configured to control an irradiation position of the second charged particle beam; and
a control apparatus that controls a first driving electrical current supplied to the first electromagnetic lens and a second driving electrical current supplied to the second electromagnetic lens so that the first driving electrical current flows in one of a clockwise direction and a counter-clockwise direction with respect to an optical axis of the first electromagnetic lens and the second driving electrical current flows in an opposite one of the clockwise and counter-clockwise directions with respect to an optical axis of the second electromagnetic lens so that a polarity of the first static magnetic field and a polarity of the second static magnetic field are reversed with respect to each other.

2. The charged particle beam optical system according to claim 1, wherein
the first static magnetic field is generated in a space between the first irradiation optical system and an object.

3. The charged particle beam optical system according to claim 1, wherein
the second static magnetic field is generated in a space between the second irradiation optical system and an object.

4. The charged particle beam optical system according to claim 2, wherein
the first static magnetic field in the space is weakened by the second static magnetic field.

5. The charged particle beam optical system according to claim 1, wherein
the first static magnetic field generated by the first electromagnetic lens of the first irradiation optical system controls the first charged particle beam, and
the second static magnetic field generated by the second electromagnetic lens of the second irradiation optical system controls the second charged particle beam.

6. The charged particle beam optical system according to claim 5, wherein
the first static magnetic field and the second static magnetic field are weakened by each other.

7. The charged particle beam optical system according to claim 1, wherein
the first irradiation optical system is adjacent to the second irradiation optical system.

8. The charged particle beam optical system according to claim 7, further comprising a plurality of groups each of which includes the first irradiation optical system and the second irradiation optical system that are adjacent to each other,
wherein the first irradiation optical system and the second irradiation optical system are arranged alternately.

9. The charged particle beam optical system according to claim 5, wherein
a portion of the first static magnetic field is a leaked magnetic field that is leaked to a space between the first irradiation optical system and an object, and
a portion of the second static magnetic field is a leaked magnetic field that is leaked to a space between the second irradiation optical system and the object.

10. The charged particle beam optical system according to claim 9, wherein
at least one of the first irradiation optical system and the second irradiation optical system comprises:
a diaphragm member having a first aperture through which the charged particle beam is allowed to pass, the diaphragm member disposed between the space and the electromagnetic lens of the at least one of the first and second irradiation optical systems.

11. The charged particle beam optical system according to claim 10, wherein
the at least one of the first irradiation optical system and the second irradiation optical system further comprises a beam shaping member having a plurality of second apertures through which the charged particle beam is allowed to pass,
the charged particle beam is irradiated to the object after passing through the plurality of second apertures and then passing through the first aperture, and
the electromagnetic lens of the at least one of the first and second irradiation optical systems is disposed between the diaphragm member and the beam shaping member.

12. The charged particle beam optical system according to claim 1, wherein
the first and second deflectors control an irradiated direction of the first and second charged particle beams, respectively.

13. An exposure apparatus comprising the charged particle beam optical system according to claim 1.

14. An exposure method of exposing an object by using the exposure apparatus according to claim 13.

15. A device manufacturing method comprising a lithography step,
the object being exposed by the exposure method according to claim 14 in the lithography step.

16. The charged particle beam optical system according to claim 1, wherein
the first and second irradiation optical systems are controllable such that the first charged particle beam from the first irradiation optical system and the second charged particle beam from the second irradiation optical system irradiate an object.

17. The charged particle beam optical system according to claim 1, wherein
the first and second irradiation optical systems are arranged such that a portion of the first static magnetic field and a portion of the second static magnetic field are overlapped.

* * * * *